United States Patent
Kawai et al.

(10) Patent No.: US 9,070,589 B2
(45) Date of Patent: Jun. 30, 2015

(54) NONVOLATILE SEMICONDUCTOR MEMORY DEVICE

(71) Applicant: Kabushiki Kaisha Toshiba, Minato-ku (JP)

(72) Inventors: Tomoya Kawai, Yokkaichi (JP); Jun Fujiki, Yokohama (JP); Yoshiaki Fukuzumi, Yokkaichi (JP); Hideaki Aochi, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/018,543

(22) Filed: Sep. 5, 2013

(65) Prior Publication Data
US 2014/0252443 A1    Sep. 11, 2014

(30) Foreign Application Priority Data
Mar. 6, 2013   (JP) ................................. 2013-044205

(51) Int. Cl.
H01L 27/115    (2006.01)

(52) U.S. Cl.
CPC ................................. H01L 27/11578 (2013.01)

(58) Field of Classification Search
CPC ............ H01L 29/66833; H01L 29/792; H01L 27/11578; H01L 27/1158; H01L 27/11582
USPC .......................................... 257/315, 324, 326
See application file for complete search history.

(56) References Cited

U.S. PATENT DOCUMENTS

| | | | |
|---|---|---|---|
| 2010/0117143 A1 | 5/2010 | Lee et al. | |
| 2010/0163968 A1 | 7/2010 | Kim et al. | |
| 2010/0207190 A1* | 8/2010 | Katsumata et al. | 257/319 |
| 2011/0019486 A1 | 1/2011 | Jang et al. | |
| 2011/0291178 A1 | 12/2011 | Sasaki et al. | |
| 2012/0223380 A1 | 9/2012 | Lee et al. | |
| 2012/0231593 A1* | 9/2012 | Joo et al. | 438/264 |
| 2013/0028024 A1 | 1/2013 | Tanzawa | |
| 2013/0168745 A1* | 7/2013 | Joo | 257/288 |

FOREIGN PATENT DOCUMENTS

| | | |
|---|---|---|
| JP | 2004-507091 | 3/2004 |
| JP | 2010-118659 | 5/2010 |

(Continued)

OTHER PUBLICATIONS

Japanese Office Action mailed on May 19, 2015 in corresponding Japanese application No. 2013-044205, with English translation, citing document AO therein (6 pages).

*Primary Examiner* — Daniel Shook
(74) *Attorney, Agent, or Firm* — Oblon, McClelland, Maier & Neustadt, L.L.P.

(57) ABSTRACT

According to one embodiment, a nonvolatile semiconductor memory device comprises a semiconductor substrate, a first layer formed above the semiconductor substrate, a first conductive layer, an inter-electrode insulating layer, and a second conductive layer sequentially stacked above the first layer, a memory film formed on an inner surface of each of a pair of through holes provided in the first conductive layer, the inter-electrode insulating layer, and the second conductive layer and extending in a stacking direction, a semiconductor layer formed on the memory film in the pair of through holes, and a metal layer formed in part of the pair of through holes and/or in part of a connection hole that is provided in the first layer and connects lower end portions of the pair of through holes, the metal layer being in contact with the semiconductor layer.

28 Claims, 25 Drawing Sheets

(56) References Cited

FOREIGN PATENT DOCUMENTS

| | | |
|---|---|---|
| JP | 2010-157734 | 7/2010 |
| JP | 2011-028833 | 2/2011 |
| JP | 2011-49206 | 3/2011 |
| JP | 2011-249559 | 12/2011 |

* cited by examiner

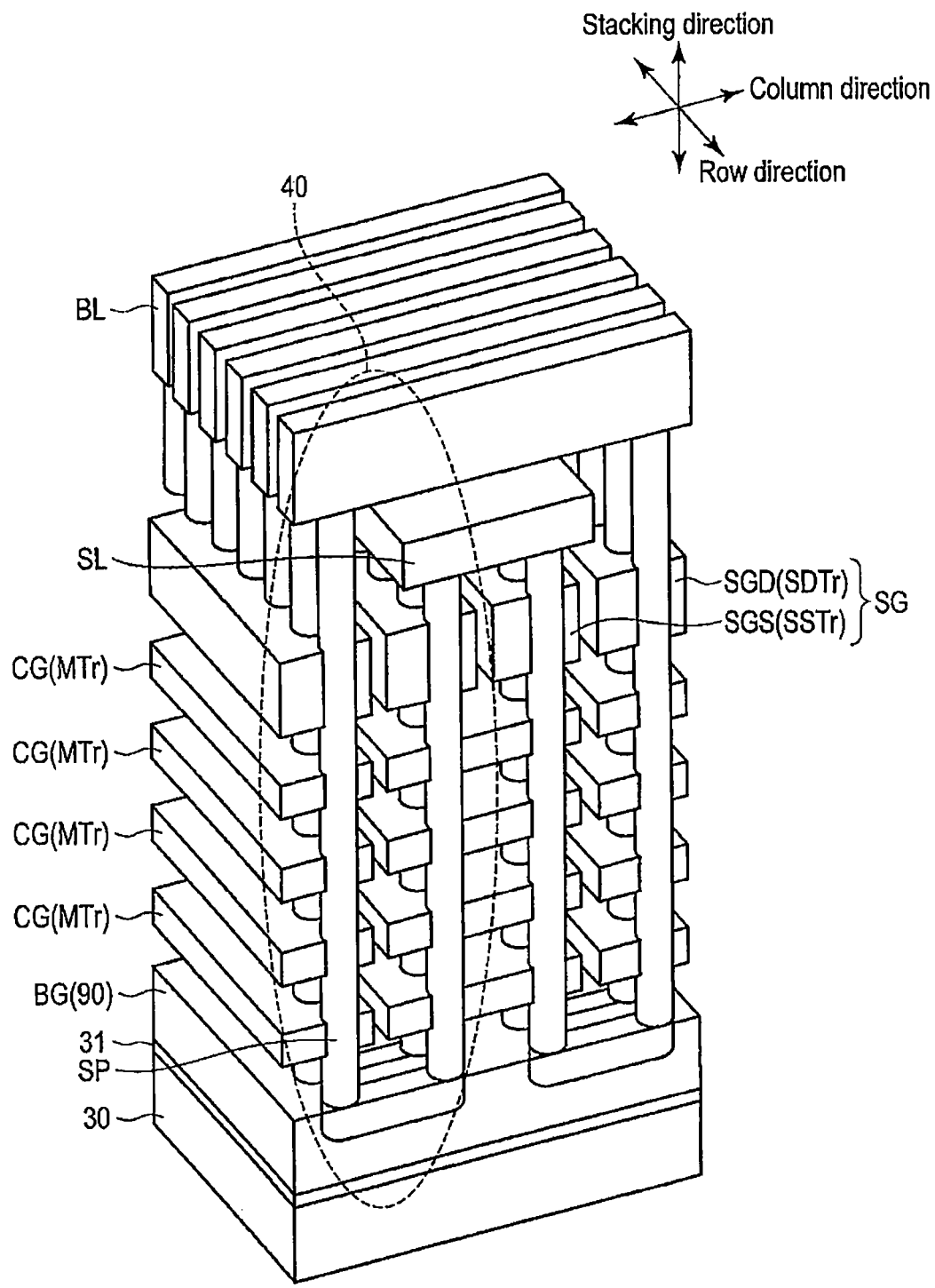
F I G. 2

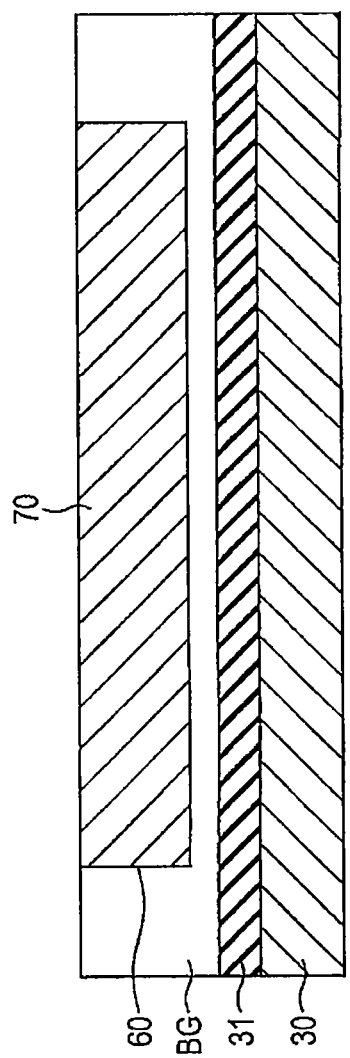
F I G. 5
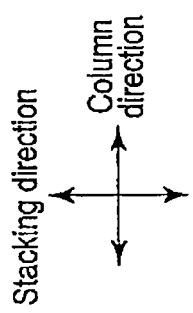

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2013-044205, filed Mar. 6, 2013, the entire contents of which are incorporated herein by reference.

FIELD

Embodiments described herein relate generally to a nonvolatile semiconductor memory device.

BACKGROUND

As a NAND flash memory, there is proposed a three-dimensionally stacked memory formed by a collective process so as to be stacked in the vertical direction to suppress an increase in the process cost.

In the three-dimensionally stacked memory, a cylindrical hole (memory hole) is formed at once in a plurality of electrodes stacked on a semiconductor substrate. A memory film is formed on the inner wall of the hole, and a polysilicon film (semiconductor pillar) serving as a channel is then formed inside the hole. NAND strings (memory strings) each formed from a plurality of MONOS memory cells connected in series in the stacking direction can thus be formed at once.

There is also proposed a collectively processed three-dimensionally stacked memory using, as a channel, a U-shaped semiconductor pillar formed from a pair of pillar portions and a connection portion that connects the pillar portions at the lower end. In this case, memory strings are formed along the U-shaped semiconductor pillars.

BRIEF DESCRIPTION OF THE DRAWINGS

FIG. 2 is a perspective view showing a NAND string according to the first embodiment;

FIGS. 5, 6, 7, 8, 9, 10, 11, 12, 13, 14, and 15 are sectional views showing steps in the manufacture of the NAND string according to the first embodiment;

DETAILED DESCRIPTION

Figure 1:
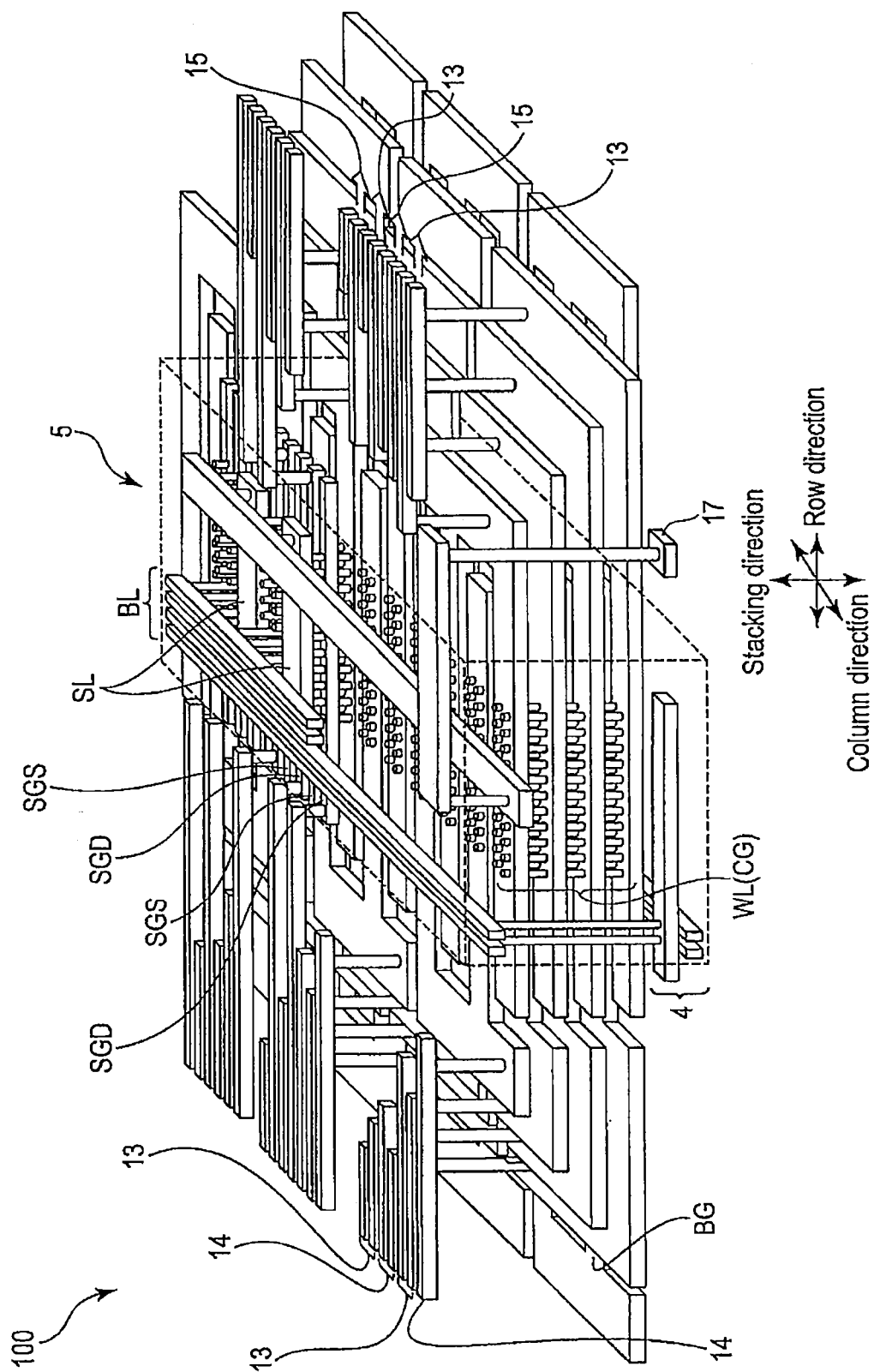
FIG. 1 is a perspective view showing an example of the overall arrangement of a nonvolatile semiconductor memory device according to the first embodiment.

In general, according to one embodiment, a nonvolatile semiconductor memory device includes a semiconductor substrate, a first layer formed above the semiconductor substrate, a first conductive layer, an inter-electrode insulating layer, and a second conductive layer sequentially stacked above the first layer, a memory film formed on an inner surface of each of a pair of through holes provided in the first conductive layer, the inter-electrode insulating layer, and the second conductive layer and extending in a stacking direction, a semiconductor layer formed on the memory film in the pair of through holes and partially crystallized, and a metal layer formed in at least part of the pair of through holes and/or in at least part of a connection hole that is provided in the first layer and connects lower end portions of the pair of through holes, the metal layer being in contact with the semiconductor layer.

In a collectively processed three-dimensionally stacked memory using a U-shaped semiconductor pillar (U-shaped (pipe-shaped) three-dimensionally stacked memory), a so-called back gate transistor is formed in a connection portion that connects a pair of pillar portions. The back gate transistor has no function of a memory, and is controlled to be always ON during the operation. That is, the back gate transistor need only be always ON and need not be ON/OFF-controlled during the operation. Actually, however, the back gate transistor is connected to a control circuit and controlled as a transistor. Hence, the back gate transistor is a redundant portion which complicates operation control and circuit layout design.

In this embodiment, a metal layer is formed in the back gate transistor portion to obviate the necessity of controlling the back gate transistor, thereby solving the above-described problem.

The embodiments will now be described with reference to the accompanying drawing. The same reference numerals denote the same parts throughout the drawings. A repetitive description will be made as needed.

<First Embodiment>

A nonvolatile semiconductor memory device according to the first embodiment will be described with reference to FIGS. 1, 2, 3, 4, 5, 6, 7, 8, 9, 10, 11, 12, 13, 14, and 15. In the first embodiment, a metal layer 70 is formed on the inner surface of a connection hole 60 provided in a back gate BG. This makes it possible to obviate the necessity of control of the back gate BG and a control circuit therefor and relax operation control and circuit layout. The nonvolatile semiconductor memory device according to the first embodiment will be described below.

[Example of Overall Arrangement]

An example of the overall arrangement of the nonvolatile semiconductor memory device according to the first embodiment will be described first with reference to FIG. 1.

FIG. 1 is a perspective view showing an example of the overall arrangement of the nonvolatile semiconductor memory device according to the first embodiment.

As shown in FIG. 1, a memory cell array 5 includes a plurality of word lines WL (control gates CG), a plurality of bit lines BL, a plurality of source lines SL, a plurality of back gates BG, a plurality of source-side select gates SGS, and a plurality of drain-side select gates SGD.

In the memory cell array 5, memory cell transistors MTr for storing data are arranged at the intersections between the plurality of stacked word lines WL and semiconductor pillars SP to be described later. NAND strings 40 are formed by the plurality of memory cell transistors MTr having current paths connected in series along the semiconductor pillars SP. The plurality of NAND strings 40 are arranged in a matrix. Various kinds of structures of the NAND strings 40 in the memory cell array 5 will be described later with reference to FIGS. 2 and 3.

The row-direction ends of the plurality of stacked word lines WL are stepped, and a contact is connected to the upper surface of each step. These contacts are connected to interconnections, respectively, at their upper portions. That is, each word line WL is connected to a word line driving circuit 13 via the contact and the interconnection. The word line driving circuit 13 controls the voltage to be applied to each word line WL.

In the column direction, the even-numbered word lines WL are connected to each other on the one-end side in the row direction, and the odd-numbered word lines WL are connected to each other on the other-end side in the row direction. Note that although FIG. 1 illustrates an example in which four layers of word lines WL are stacked, the number of layers is not limited to this.

A contact is connected to the upper surface of an row-direction end of each source line SL, and an interconnection is connected to the upper portion of the contact. Each source line SL is connected to a source line driving circuit 17 via the contact and the interconnection. The source line driving circuit 17 controls the voltage to be applied to the source line SL. Note that, for example, one source line driving circuit 17 is connected to a plurality of source lines SL.

A contact is connected to the upper surface of an row-direction end of each source-side select gate SGS, and an interconnection is connected to the upper portion of the contact. Each source-side select gate SGS is connected to a source-side select gate line driving circuit 14 via the contact and the interconnection. The source-side select gate line driving circuit 14 controls the voltage to be applied to each source-side select gate SGS.

A contact is connected to the upper surface of a row-direction end of each drain-side select gate SGD, and an interconnection is connected to the upper portion of the contact. Each drain-side select gate SGD is connected to a drain-side select gate line driving circuit 15 via the contact and the interconnection. The drain-side select gate line driving circuit 15 controls the voltage to be applied to each drain-side select gate SGD.

A contact is connected to the lower surface of a column-direction end of each bit line BL, and a sense amplifier 4 is connected to the lower portion of the contact. The sense amplifier 4 controls the voltage to be applied to each bit line BL.

In the first embodiment, the back gate BG need not be controlled. For this reason, no back gate control circuit to control the back gate BG is provided. Note that although the back gate BG has no function of a transistor in the first embodiment, it will be described as the back gate BG in this specification. Details of the back gate BG will be described later.

Referring to FIG. 1, all interconnections connected to the various driving circuits are formed in the interconnection layer of the same level. Instead, the interconnections may be formed in interconnection layers of different levels. The number of various driving circuits is decided in accordance with the number of gates. One driving circuit can be connected to one gate or a predetermined number of gates.

[Example of Arrangement of NAND String]

An example of the arrangement of the NAND string 40 according to the first embodiment will be described next with reference to FIGS. 2, 3, and 4.

FIG. 2 is a perspective view showing the NAND string 40 according to the first embodiment. FIG. 3 is a sectional view showing the NAND string 40 according to the first embodiment, and illustrates the sectional structure of the NAND string 40 along the column direction. Note that the memory film is not illustrated in FIG. 2, and the source lines SL and the bit lines BL are not illustrated in FIG. 3.

Figure 3:
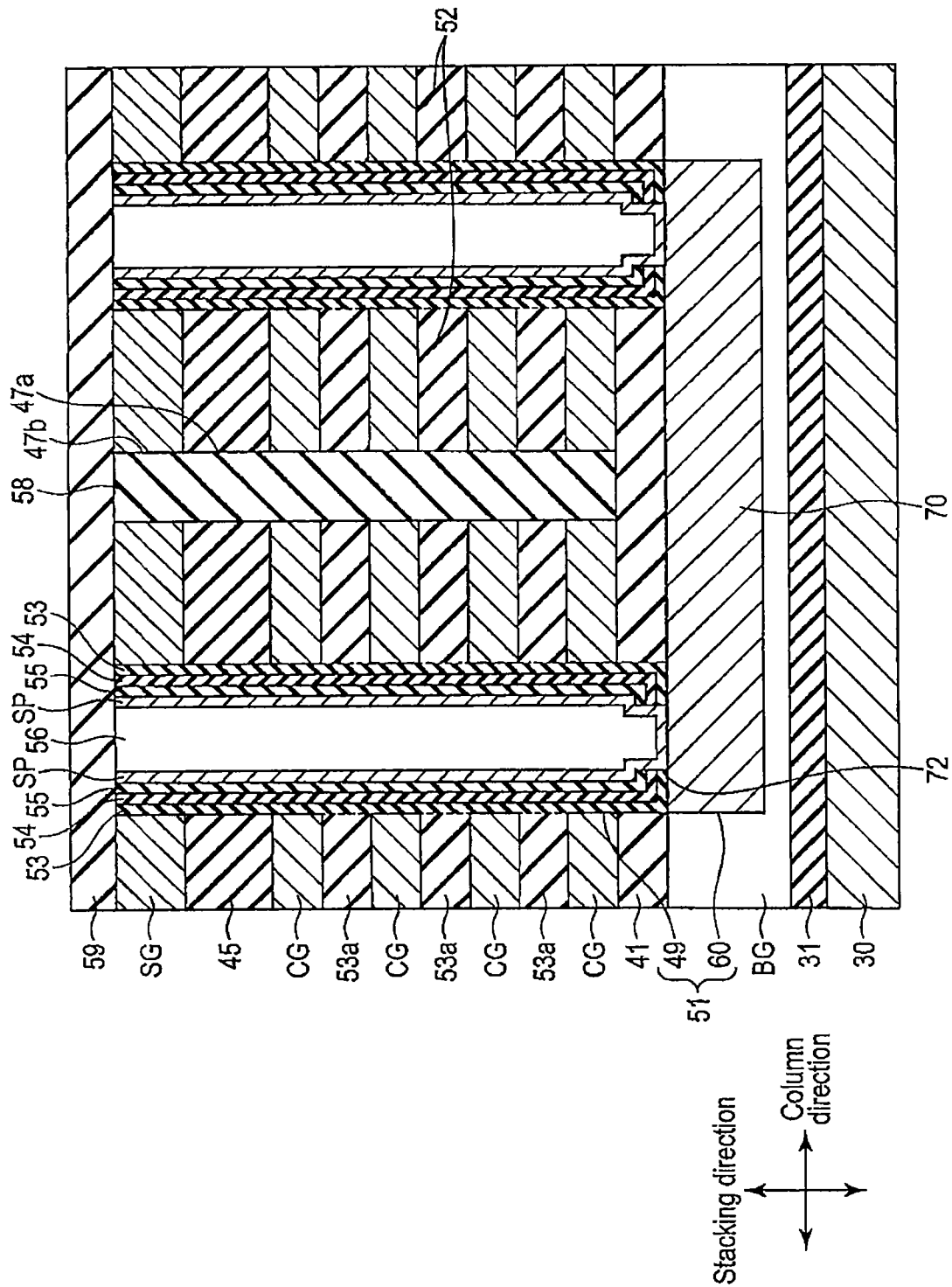
FIG. 3 is a sectional view showing the NAND string according to the first embodiment.

As shown in FIGS. 2 and 3, in the memory cell array 5, the NAND string 40 is formed above a semiconductor substrate 30, and includes the back gate BG, the plurality of control gates CG, the select gate SG, the semiconductor pillar (semiconductor layer) SP, the memory film (block insulating layer 53, charge storage layer 54, and tunnel insulating layer 55), and the metal layer 70.

Note that in this specification, the block insulating layer 53, the charge storage layer 54, and the tunnel insulating layer 55 will be referred to as a memory film, though it is not necessarily a film for storing data.

The back gate BG is formed on an insulating layer 31 on the semiconductor substrate 30. The back gate BG is formed to two-dimensionally spread. The back gate BG is formed from an insulating layer of silicon oxide (for example, $SiO_2$), silicon nitride (for example, SiN), a high-k material, or the like. In the first embodiment, the back gate BG does not form a transistor together with the semiconductor pillar SP but forms an interconnection 90 by incorporating the metal layer 70 and is always continuity, as will be described later in detail.

The plurality of control gates CG are formed on an insulating layer 41 on the back gate BG. The plurality of control gates CG are stacked while making inter-electrode insulating layers 53a intervening between them. In other words, the plurality of inter-electrode insulating layers 53a and the plurality of control gates CG are alternately stacked on an insulating layer 41. Each control gate CG is formed from, for example, a doped silicon layer containing an impurity (for example, boron).

The select gate SG is formed on an insulating layer 45 on the uppermost control gate CG. The select gate SG is formed from, for example, a doped silicon layer, like the control gates CG.

The source line SL is formed on an insulating layer 59 on the select gate SG. The bit line BL is further formed on an insulating layer (not shown).

A U-shaped memory hole 51 is formed in the select gate SG, the control gates CG, the back gate BG, the insulating layers 41 and 45, and the inter-electrode insulating layers 53a. The U-shaped memory hole 51 is formed from a pair of through holes 49 arranged in the column direction, and the connection hole 60 that connects the lower ends of the pair of through holes 49. The through holes 49 are formed to extend through the select gate SG, the control gates CG, the insulating layers 41 and 45, and the inter-electrode insulating layers 53a in the stacking direction. The connection hole 60 is formed to extend through the back gate BG in the column direction.

A slit 47a extending between the pair of through holes 49 in the row direction and the stacking direction is formed in the control gates CG, the insulating layers 41 and 45, and the inter-electrode insulating layers 53a. The control gates CG, the insulating layers 41 and 45, and the inter-electrode insulating layers 53a are thus divided along the row direction. In addition, an opening portion 47b extending above the slit 47a in the row direction and the stacking direction is formed in the select gate SG to open the slit 47a. The select gate SG is thus divided along the row direction. One side serves as the drain-side select gate SGD, and the other side serves as the source-side select gate SGS. An insulating material 58 is buried in the slit 47a and the opening portion 47b.

Although not illustrated, portions of the select gates SG and the control gates CG in contact with the insulating material 58 may be silicidized.

The memory film is formed on the inner surface of each through hole 49. The memory film is formed from the block insulating layer 53, the charge storage layer 54, and the tunnel insulating layer 55.

The block insulating layer 53 is formed on the inner surface of the through hole 49. That is, the block insulating layer 53 is formed on the select gate SG, the control gates CG, the inter-electrode insulating layers 53a, and the insulating layers 41 and 45 in the through hole 49. The block insulating layer 53 is also formed on the metal layer 70 to be described later on the bottom surface of the through hole 49. The block insulating layer 53 is formed from an insulating layer of, for example, silicon oxide or silicon nitride or a stacked structure thereof.

The block insulating layer 53 may be integrated with the inter-electrode insulating layers 53a. That is, each inter-electrode insulating layer 53a may have a structure formed by burying the block insulating layer 53 in a gap 52 between two control gates CG adjacent in the stacking direction.

The charge storage layer 54 is formed on the block insulating layer 53 in the through hole 49. The charge storage layer 54 is formed from an insulating layer of, for example, silicon oxide or silicon nitride.

The tunnel insulating layer 55 is formed on the charge storage layer 54 in the through hole 49. The tunnel insulating layer 55 is formed from an insulating layer of, for example, silicon oxide or silicon nitride or a stacked structure thereof. Note that the tunnel insulating layer 55 may be an air gap layer.

The block insulating layer 53, the charge storage layer 54 and the tunnel insulating layer 55 have an opening portion 72 in the bottom surface of the through hole 49. Part of the upper surface of the metal layer 70 to be described later is exposed through the opening portion 72.

The semiconductor pillar SP is formed on the memory film (tunnel insulating layer 55) in the through hole 49. The semiconductor pillar SP is also formed on the inner surface of the opening portion 72. That is, the semiconductor pillar SP is formed on the memory film (block insulating layer 53, charge storage layer 54, and tunnel insulating layer 55) and the metal layer 70 in the opening portion 72. For this reason, the semiconductor pillar SP is in contact with the metal layer 70 exposed to the bottom surface of the opening portion 72. The semiconductor pillar SP is made of a semiconductor material (for example, Si, SiGe, or Ge) crystallized (single-crystallized or poly-crystallized) by MILC (Metal Induced Lateral Crystallization) to be described later. The semiconductor pillar SP functions as the channels of various kinds of transistors.

A core layer 56 is formed on the semiconductor pillar SP in each through holes 49. The core layer 56 is formed from an insulating layer of, for example, silicon oxide and fills the U-shaped memory hole 51. Note that the core layer 56 may be a cavity not to fill the through hole 49.

The metal layer 70 is formed in the inner surface of the connection hole 60. That is, the metal layer 70 is formed on the back gate BG in the connection hole 60. The connection hole 60 is thus filled. The metal layer 70 comes into contact with the semiconductor pillar SP through the opening portion 72. The metal layer 70 is made of a metal material that has an electric conductivity equal to or higher than that of Si of the semiconductor pillar SP and crystallizes Si by MILC or the like. That is, the metal layer 70 functions as a catalyst in the MILC. Examples of the metal material are Ni (nickel), Co (cobalt), Al (aluminum), and Pd (palladium). The metal layer 70 may be made of a silicide of each metal material. The metal layer 70 is preferably made of a metal material that silicidizes at a temperature of 600° C. or less.

Note that although the interface between the semiconductor pillar SP and the metal layer 70 is preferably flush with the upper surface of the back gate BG, the present invention is not limited to this. That is, the connection hole 60 need not always be filled with only the metal layer 70. The semiconductor pillar SP may be formed from the through holes 49 to part of the connection hole 60 through the opening portion 72 in a connected state. A portion near the lower end of the semiconductor pillar SP (a portion in contact with the metal layer 70) may contain a silicide. A portion near the upper end of the semiconductor pillar SP (a portion in contact with the insulating layer 59 formed later) may contain a silicide. Not only the portions of the semiconductor pillar SP in contact with the metal layer 70 and the insulating layer 59 but the semiconductor pillar SP may contain a silicide. The silicide is formed by the MILC process.

Various kinds of transistors are formed by the semiconductor pillar SP and the memory film and various gates formed around it. The NAND string 40 is formed along the semiconductor pillar SP and the metal layer 70 while using the semiconductor pillar SP as the channels of the various kinds of transistors.

More specifically, the memory cell transistor MTr is formed by the control gate CG, the semiconductor pillar SP, and the memory film formed between them. In addition, the select transistors (drain-side select transistor SDTr and source-side select transistor SSTr) are formed by the select gates SG (drain-side select gate SGD and source-side select gate SGS), the semiconductor pillar SP, and the memory film formed between them.

Note that despite its name, the memory film does not store data in the select transistor and simply functions as a gate insulating film.

In the first embodiment, the semiconductor pillar SP and the memory film are not formed in the connection hole 60 provided in the back gate BG. For this reason, a so-called back gate transistor is not formed in the back gate BG. The metal layer 70 is formed in the connection hole 60 provided in the back gate BG. The interconnection 90 that is always continuity is thus formed in the back gate BG.

Figure 4:
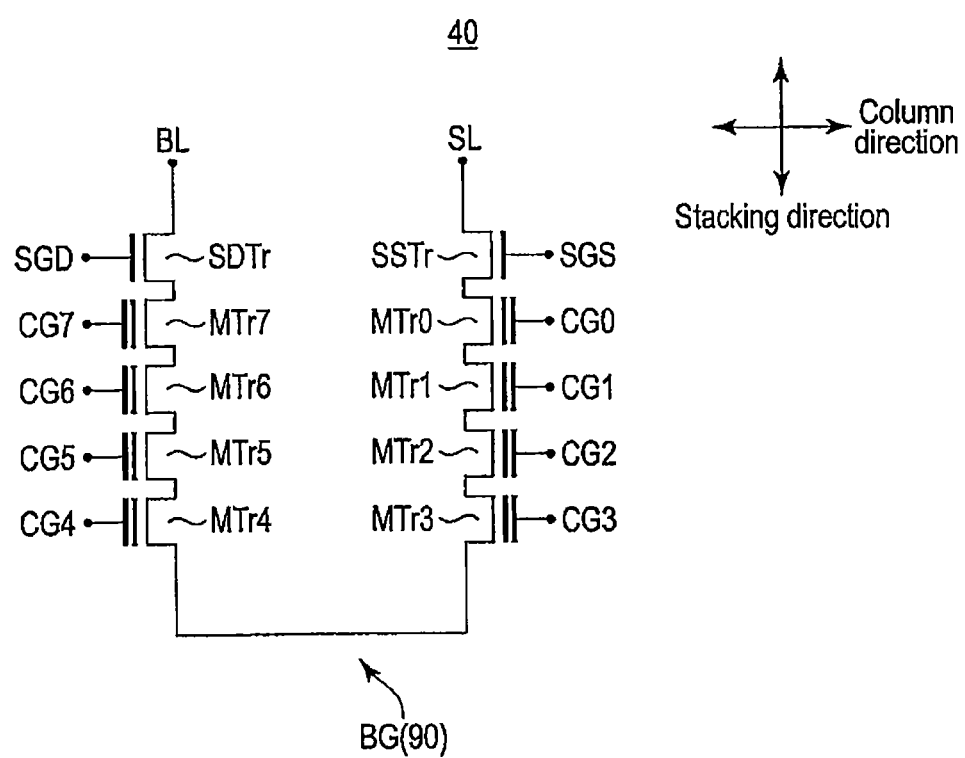
FIG. 4 is a circuit diagram showing the NAND string according to the first embodiment.

FIG. 4 is a circuit diagram showing the NAND string 40 according to the first embodiment.

As shown in FIG. 4, the NAND string 40 includes the source-side select transistor SSTr, the drain-side select transistor SDTr, and memory cell transistors MTr0 to MTr7.

The memory cell transistors MTr0 to MTr7 have current paths connected in series between the source-side select transistor SSTr and the drain-side select transistor SDTr. The interconnection 90 is arranged between the memory cell transistor MTr3 and the memory cell transistor MTr4. The interconnection 90 is formed in the back gate BG.

More specifically, the current paths of the memory cell transistors MTr0 to MTr3 are connected in series in the stacking direction. In addition, the current paths of the memory cell transistors MTr4 to MTr7 are connected in series in the stacking direction. The interconnection 90 is arranged between the memory cell transistor MTr3 and the memory cell transistor MTr4 on the lower side in the stacking direction, thereby connecting the current paths in series. That is, as the NAND string 40, the current paths of the source-side select transistor SSTr, the drain-side select transistor SDTr, and the memory cell transistors MTr0 to MTr7 are connected in series along the semiconductor pillar SP and the metal layer 70 shown in FIG. 3.

The control gates of the memory cell transistors MTr0 to MTr7 are connected to control gates CG0 to CG7, respectively. In addition, the gate of the source-side select transistor SSTr is connected to the source-side select gate SGS, and the gate of the drain-side select transistor SDTr is connected to the drain-side select gate SGD.

When the metal layer 70 and the pair of semiconductor pillars SP are formed to be in contact through the opening portions 72 in the above-described way, the channel of the memory cell transistor MTr3 and the channel of the memory cell transistor MTr4 can electrically be connected. That is, the channel of the memory cell transistor MTr3 and the channel of the memory cell transistor MTr4 can always electrically be connected by the back gate BG that functions not as a transistor but as the interconnection 90.

The control gates CG of the lowermost layer have, on their both sides (upper and lower sides), structures different from those of other control gates CG. Especially, the control gates CG of the lowermost layer may suffer electrical influence of the metal layer 70 located below. Hence, the control gates CG of the lowermost layer cannot obtain a satisfactory characteristic, and as a result, variations occur as a whole.

This can be solved by the following method.

As the first method, out of the plurality of stacked control gates CG, the control gates CG (control gates CG3 and CG4) of the lowermost layer located on the back gate BG are formed as dummy gates. When the control gates CG of the lowermost layer are used as dummy gates, the electrical influence of the metal layer 70 need not be taken into consideration. It is consequently possible to cause the other control gates CG actually used as cells to have the same structure and reduce variations in the cell characteristic.

A dummy memory cell transistor operates in the following way. At the time of write operation, a write pass voltage is applied to the dummy gate, like the control gates CG connected to the memory cell transistors MTr as nonwrite targets so no data is written in the dummy memory cell transistor. At the time of read operation, a voltage to turn on the dummy memory cell transistor is applied to the dummy gate.

As the second method, the metal layer 70 near the control gates CG of the lowermost layer is removed. More specifically, the metal layer 70 is removed through the opening portions 72, thereby removing the metal layer 70 near the ends (portions connected to the through holes 49) of the connection hole 60. That is, the metal layer 70 is formed only at the center of the connection hole 60. The semiconductor pillar SP is formed from the through holes 49 up to the ends of the connection hole 60 through the opening portions 72 in a connected state. That is, the contact surface between the metal layer 70 and the semiconductor pillar SP is provided in the connection hole 60. This makes it possible to increases the distance of closest approach between the metal layer 70 and the control gate CGs of the lowermost layer. It is therefore possible to suppress the electrical influence of the metal layer 70 on the control gates CG of the lowermost layer and reduce the variations in the cell characteristic.

One or both of the two methods described above can be applied to the NAND string 40 according to the first embodiment as needed.

[Manufacturing Method]

A method of manufacturing the nonvolatile semiconductor memory device according to the first embodiment will be described next with reference to FIGS. 5, 6, 7, 8, 9, 10, 11, 12, 13, 14, and 15.

FIGS. 5, 6, 7, 8, 9, 10, 11, 12, 13, 14, and 15 are sectional views showing steps in the manufacture of the nonvolatile semiconductor memory device (NAND string 40) according to the first embodiment.

First, as shown in FIG. 5, an insulating layer 31 made of, for example, silicon oxide is formed on a semiconductor substrate 30. A back gate BG is formed on the insulating layer 31. The back gate BG is formed from an insulating layer of silicon oxide, silicon nitride, a high-k material, or the like.

A connection hole 60 is formed in the back gate BG by photolithography and etching. The connection hole 60 extends in the column direction. A plurality of connection holes 60 are arranged in a matrix in a plane formed in the row direction and the column direction.

Next, a metal layer 70 is formed on the entire surface to fill the connection hole 60. After that, the metal layer 70 on the upper surface of the back gate BG outside the connection hole 60 is removed so that the metal layer 70 remains only in the connection hole 60. The metal layer 70 is made of a metal material that has an electric conductivity equal to or higher than that of Si of the semiconductor pillar SP and crystallizes the semiconductor pillar (for example, silicon, silicon germanium, or germanium) by MILC. That is, the metal layer 70 functions as a catalyst in the MILC. Examples of the metal material are Ni, Co, Al, and Pd. The metal layer 70 may be made of a silicide of each metal material. The metal layer 70 is preferably made of a metal material that silicidizes at a temperature of 600° C. or less.

Figure 6:
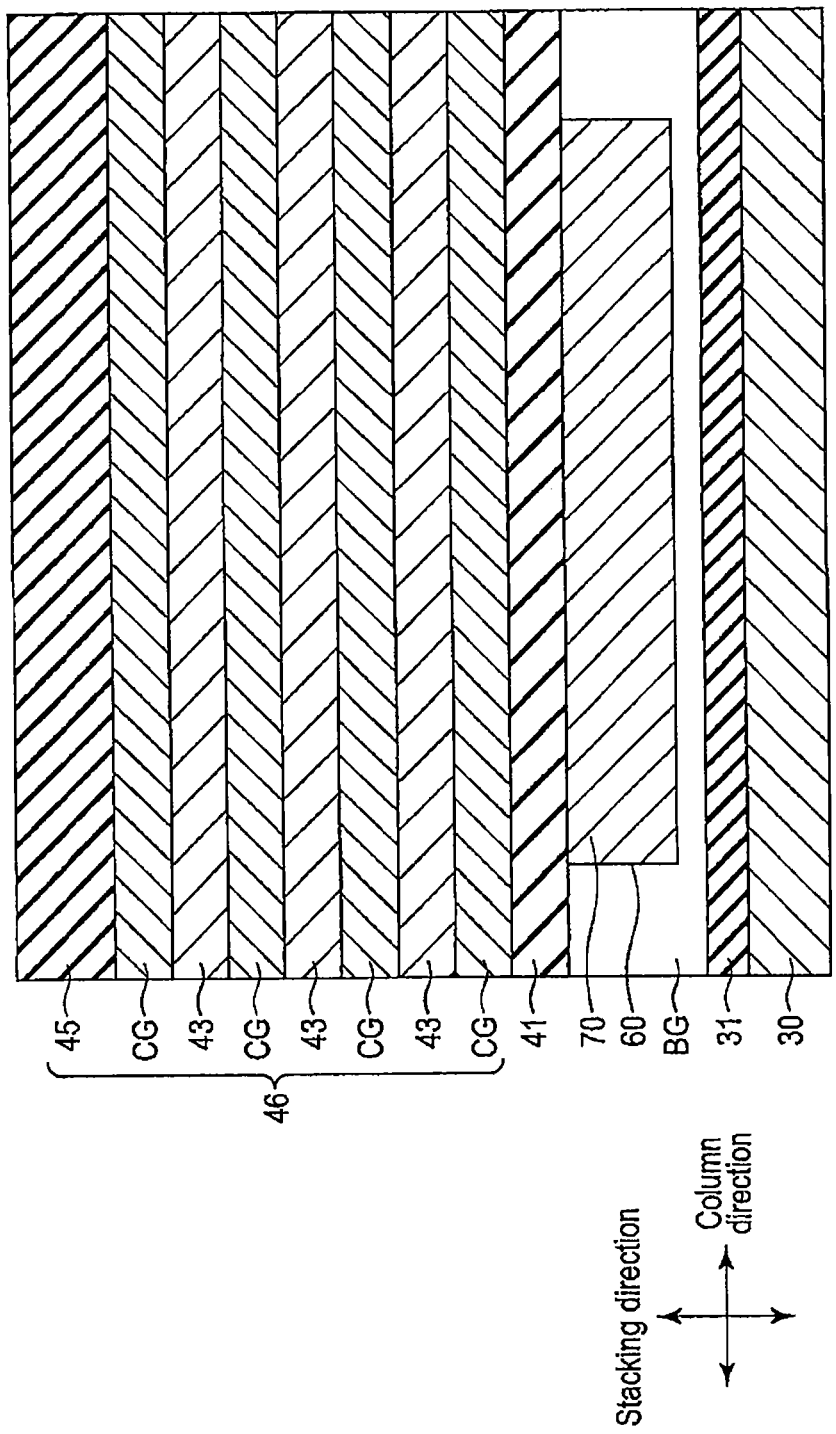

As shown in FIG. 6, an insulating layer 41 made of, for example, silicon oxide is formed on the back gate BG in which the metal layer 70 is formed. Sacrificial layers 43 and control gates CG are alternately stacked on the insulating layer 41. Each control gate CG is formed from a doped silicon (p-type polysilicon) layer containing an impurity (for example, boron). Each sacrificial layer 43 is formed from an undoped silicon layer containing no impurity. The sacrificial layers 43 are replaced with inter-electrode insulating layers 53a in a process later.

Note that in place of the sacrificial layers 43, inter-electrode insulating layers made of, for example, silicon oxide and the control gates CG may alternately be stacked. In this case, replacement of the sacrificial layers and the inter-electrode insulating layers in a process later is unnecessary.

FIG. 6 illustrates an example in which four control gates CG are stacked. However, the number of stacked layers is not limited to this.

After that, an insulating layer 45 made of, for example, silicon oxide is formed on the control gate CG of the uppermost layer. A stacked body 46 including the control gates CG, the sacrificial layers 43, and the insulating layer 45 is thus formed.

Figure 7:
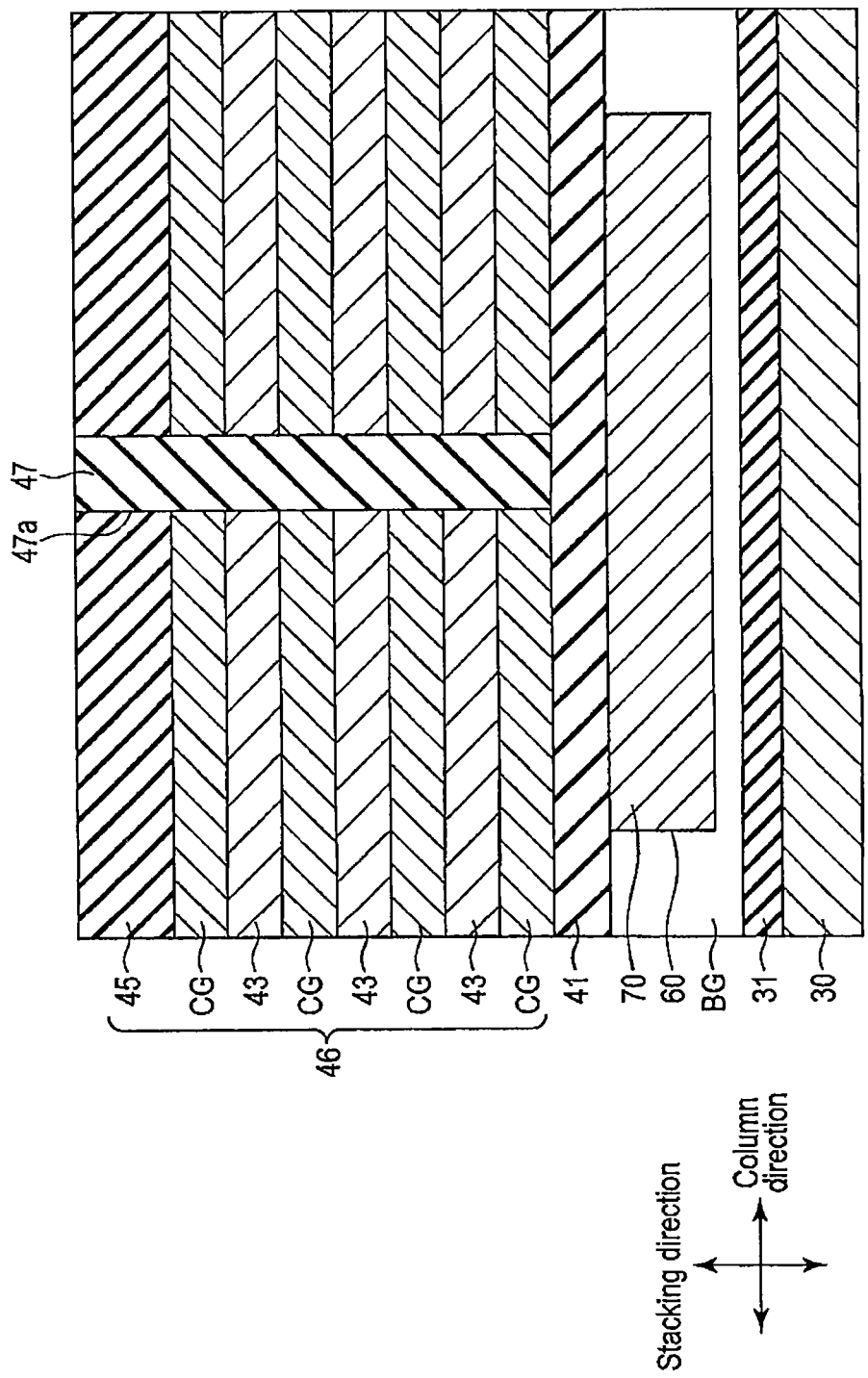

As shown in FIG. 7, a slit 47a is formed in the stacked body 46 by photolithography and etching. The slit 47a is formed along the row direction (direction perpendicular to the drawing surface) to extend through the stacked body 46. That is, the slit 47a is formed to spread in the row direction and the stacking direction to divide the stacked body 46. The slit 47a is formed to be located above the center of the metal layer 70 in the column direction. The insulating layer 41 is exposed to the bottom surface of the slit 47a.

A sacrificial material 47 made of silicon nitride is buried in the slit 47a. More specifically, after the sacrificial material 47 is formed on the entire surface until the slit 47a is filled, the sacrificial material 47 on the insulating layer 45 is removed. The sacrificial material 47 thus remains in the slit 47a so that the sacrificial material 47 extending in the row direction and the stacking direction is formed.

Figure 8:
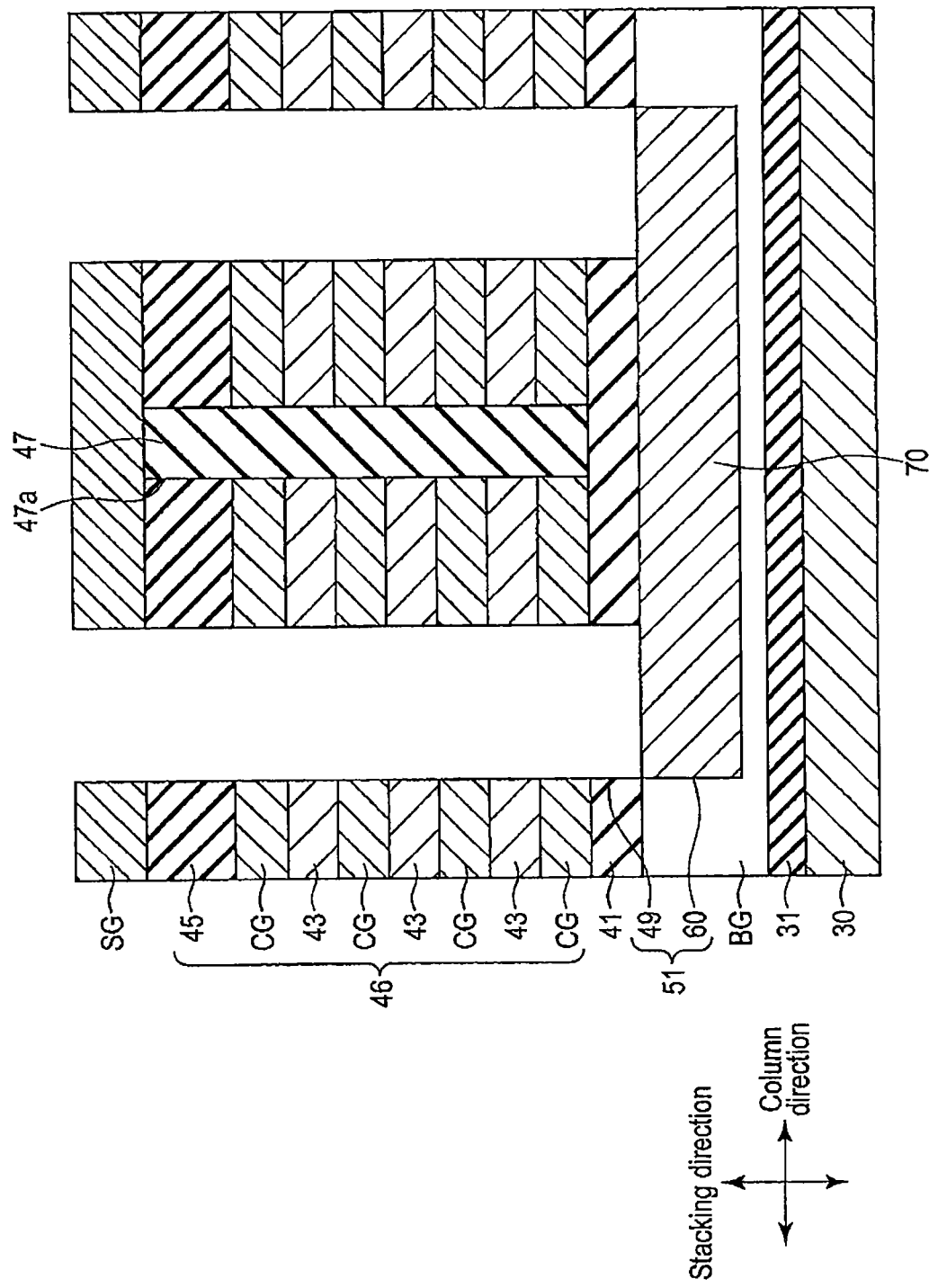

Next, as shown in FIG. 8, select gates SG (drain-side select gate SGD and source-side select gate SGS) are formed on the insulating layer 45. The select gates SG are formed for a doped silicon (p-type polysilicon) layer containing an impurity (for example, boron).

After that, a pair of through holes 49 are formed in the select gates SG, the stacked body 46, and the insulating layer 41. At this time, the pair of through holes 49 are formed to reach the two ends of the metal layer 70 in the column direction. The select gates SG, the stacked body 46, the insulating layer 41, and the metal layer 70 are thus exposed through the through holes 49.

Each through hole 49 is formed into, for example, a circular shape viewed from the stacking direction. The pair of through holes 49 are arranged in the column direction and extend in the stacking direction through the select gates SG, the stacked body 46, and the insulating layer 41.

Figure 9:
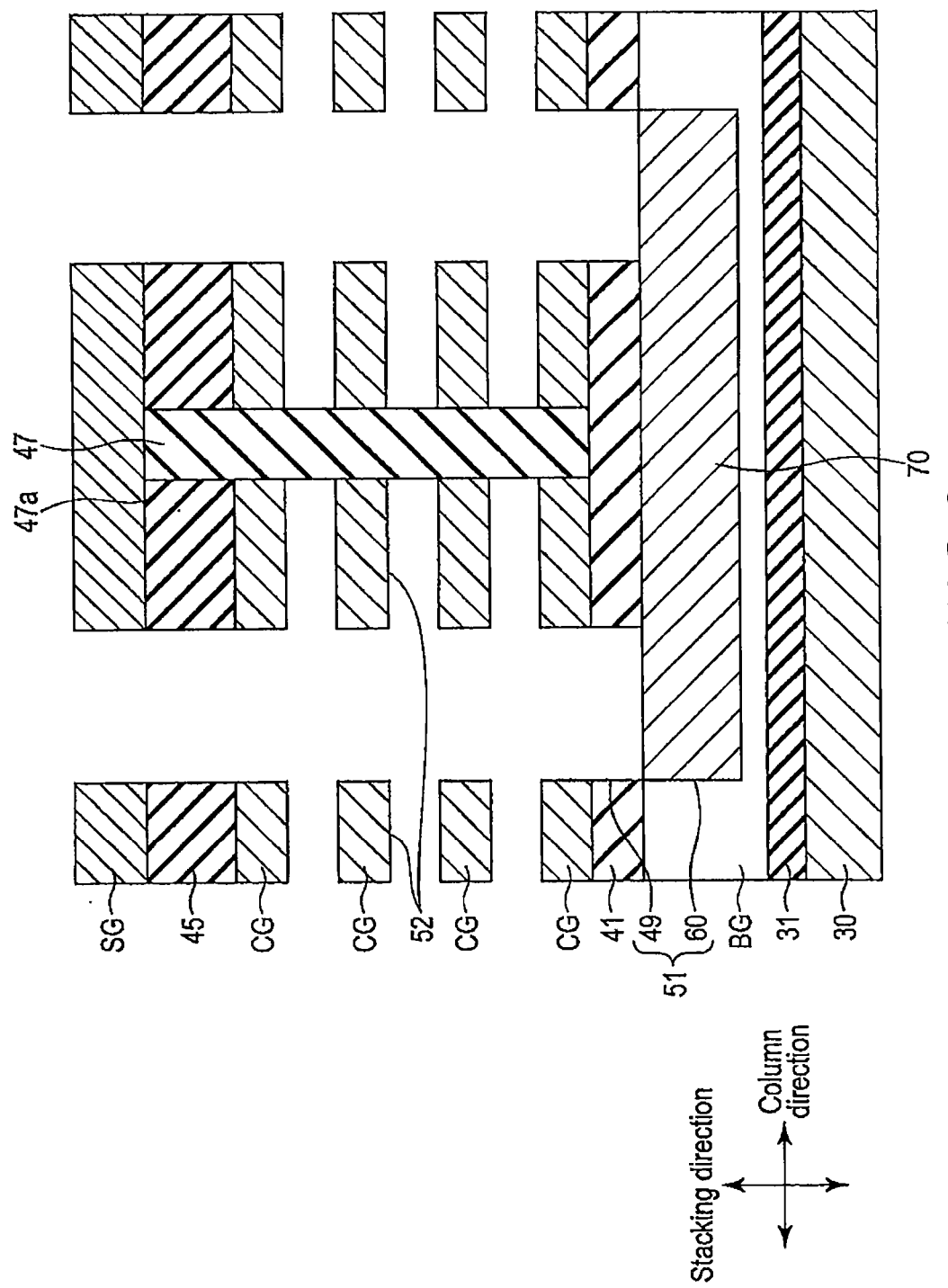

As shown in FIG. 9, wet etching is performed through the through holes 49. This wet etching is done using, for example, an alkaline etching solution. The sacrificial layers 43 in the stacked body 46 are thus removed. As a result, a gap 52 is formed between two control gates CG adjacent in the stacking direction, and the sacrificial material 47 is exposed through the gaps 52.

At this time, a high etching selectivity can be implemented between the select gates SG and control gates CG formed from the doped silicon layers and the sacrificial layers 43 formed from the undoped silicon layers by appropriately selecting the etching solution. For this reason, the select gates SG and control gates CG formed from the doped silicon layers are etched little and remain. Note that the back gate BG and the metal layer 70 formed from the insulating layers or the like are etched little and remain. The control gates CG are supported by the sacrificial material 47.

Figure 10:
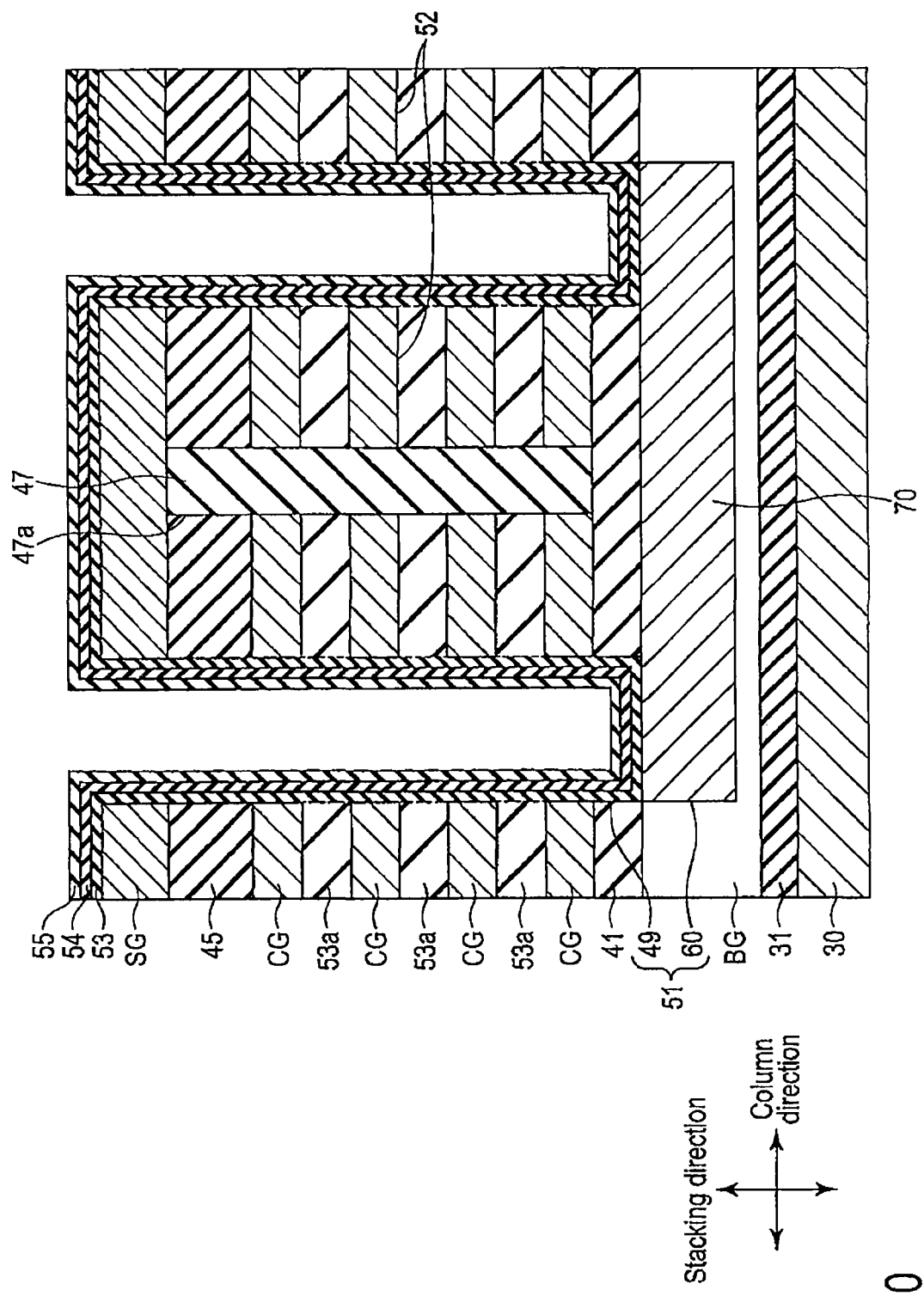

As shown in FIG. 10, a block insulating layer 53 is formed on the inner surfaces of the through holes 49 by, for example, ALD (Atomic Layer Deposition) or CVD (Chemical Vapor Deposition). That is, the block insulating layer 53 is formed on the select gates SG, the control gates CG, the insulating layers 41 and 45, and the metal layer 70 exposed in the through holes 49. The block insulating layer 53 is formed from an insulating layer of, for example, silicon oxide or silicon nitride or a stacked structure thereof.

At this time, the block insulating layer 53 is formed on the inner surfaces of the gaps 52 as well through the through holes 49. That is, the block insulating layer 53 is also formed on the control gates CG and the sacrificial material 47 exposed in the gaps 52. The inter-electrode insulating layers 53a integrated with the block insulating layer 53 are thus buried in the gaps 52. The block insulating layer 53 is also formed on the select gates SG (on the upper surfaces) outside the through holes 49.

Next, a charge storage layer 54 is formed on the block insulating layer 53 in the through holes 49 by, for example, ALD or CVD. The charge storage layer 54 is also formed on the block insulating layer 53 outside the through holes 49. The charge storage layer 54 is formed from an insulating layer of, for example, silicon oxide or silicon nitride.

Next, a tunnel insulating layer 55 is formed on the charge storage layer 54 in the through holes 49 by, for example, ALD or CVD. The tunnel insulating layer 55 is also formed on the charge storage layer 54 outside the through holes 49. The tunnel insulating layer 55 is formed from an insulating layer of, for example, silicon oxide or silicon nitride or a stacked structure thereof.

Figure 11:
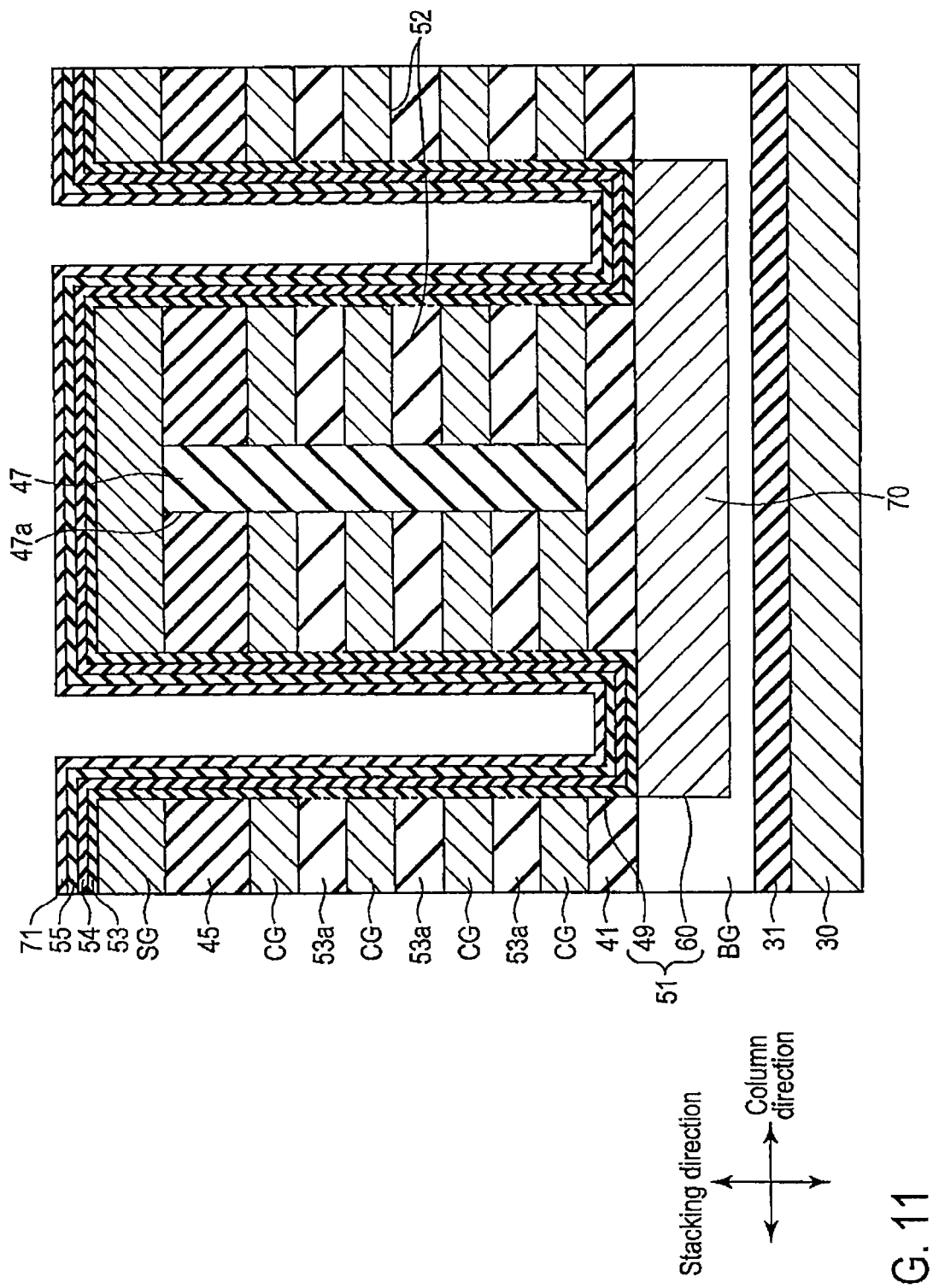

As shown in FIG. 11, a protective layer 71 is formed on the tunnel insulating layer 55 in the through holes 49 by, for example, ALD or CVD. The protective layer 71 is also formed on the tunnel insulating layer 55 outside the through holes 49. The protective layer 71 protects the surface of the tunnel insulating layer 55 in a process later. The protective layer 71 is made of, for example, undoped silicon. However, the material is not limited to this. The protective layer 71 is preferably made of a material having an etching selectivity with respect to the tunnel insulating layer 55, the charge storage layer 54, the block insulating layer 53, the select gates SG, and the metal layer 70.

Figure 12:
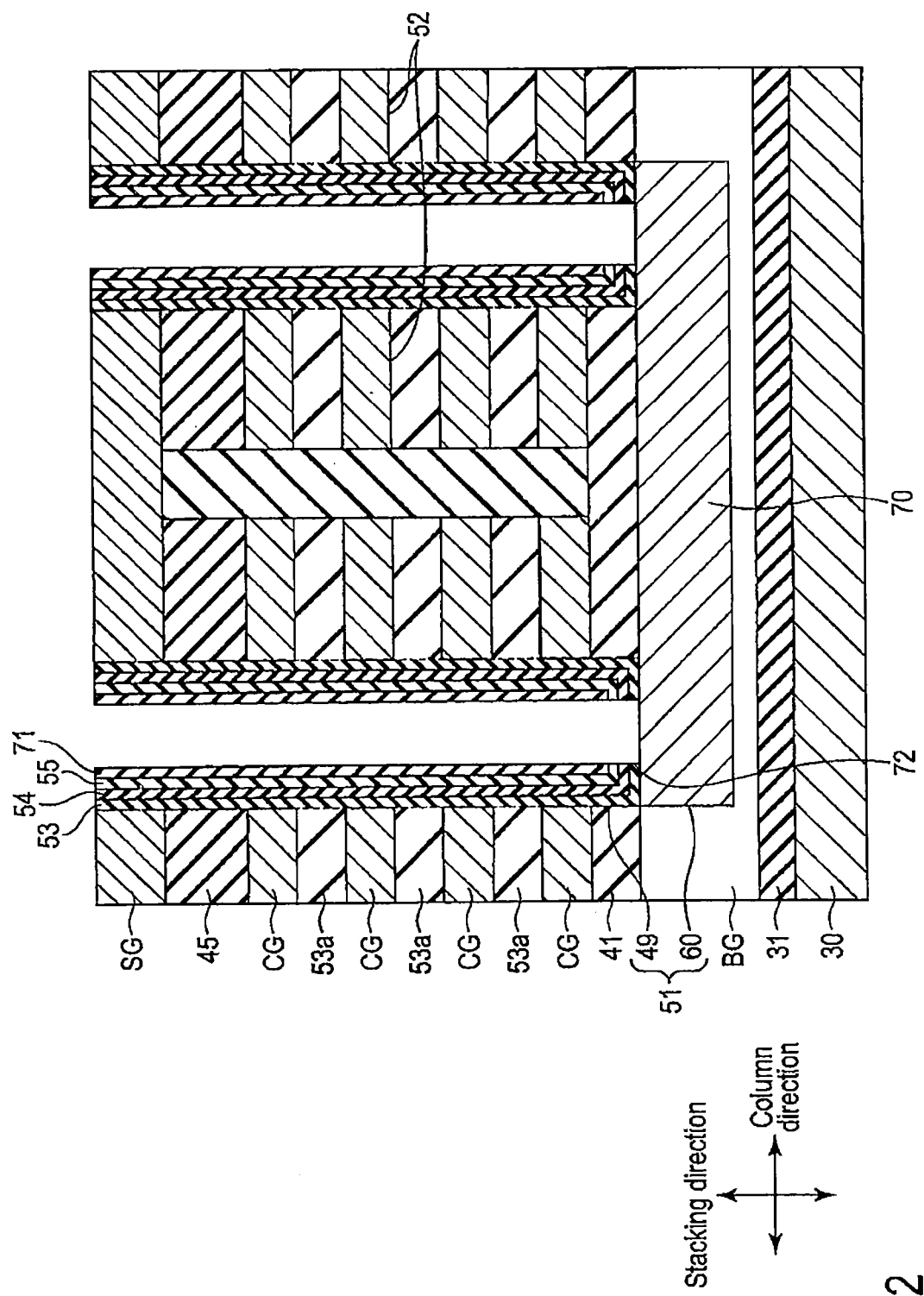

As shown in FIG. 12, the protective layer 71, the tunnel insulating layer 55, the charge storage layer 54, and the block insulating layer 53 on the bottom surfaces of the through holes 49 are removed by, for example, RIE (Reactive Ion Etching). That is, an opening portion 72 is formed in the protective layer 71, the tunnel insulating layer 55, the charge storage layer 54, and the block insulating layer 53 on the bottom surface of each through hole 49. The upper surface of the metal layer 70 is partially exposed through the opening portion 72. The diameter of the opening portion 72 almost equals, for example, the inner diameter of the protective layer 71.

At this time, the surface of the tunnel insulating layer 55 in each through hole 49 is covered with the protective layer 71. It is therefore possible to suppress damage to the surface of the tunnel insulating layer 55 by RIE.

At the same time, the protective layer 71, the tunnel insulating layer 55, the charge storage layer 54, and the block insulating layer 53 formed outside the through holes 49 are also removed.

After that, if the metal layer 70 electrically influences the control gates CG of the lowermost layer, as described above, the metal layer 70 may partially be removed by wet etching through the opening portions 72. In this wet etching, for example, a sulfuric acid hydrogen peroxide solution (a solution mixture of a sulfuric acid solution and a hydrogen peroxide solution) is used.

Figure 13:
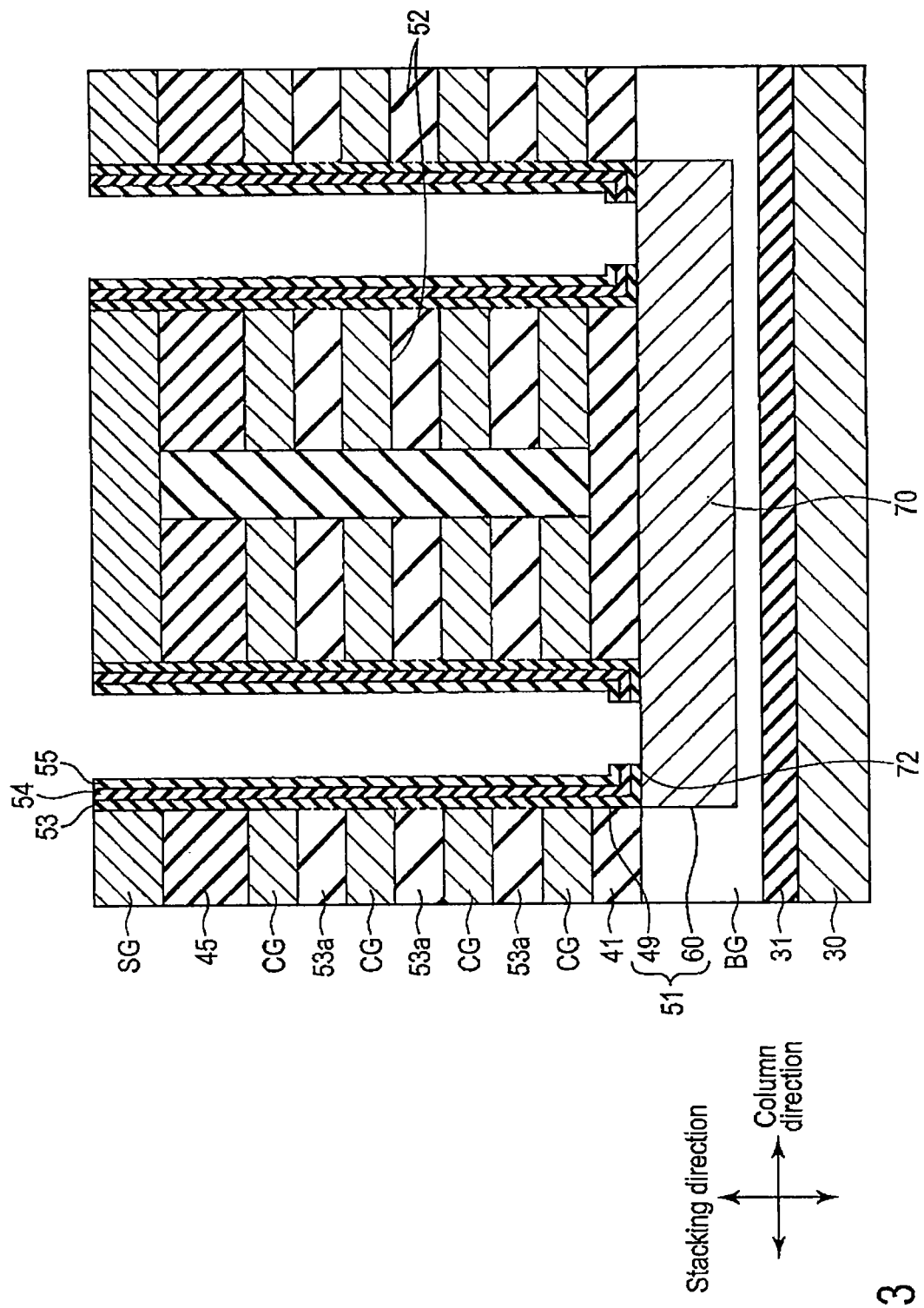

As shown in FIG. 13, the protective layer 71 is removed by, for example, wet etching. For example, when the protective layer 71 is made of undoped silicon, an alkaline etching solution is used. Note that at this time, if one of the tunnel insulating layer 55, the charge storage layer 54, and the block insulating layer 53 is made of the same material as the protective layer 71, a resist (not shown) or the like may be formed on the exposed surface (for example, upper surface) not to expose it to the drug solution of wet etching. As a method of forming the resist, for example, a resist whose viscosity is so high that it cannot enter the through holes 49 may be applied to the entire surface. Only the resist formed to cover the portions of the through holes 49 is removed by photolithography and development.

Figure 14:
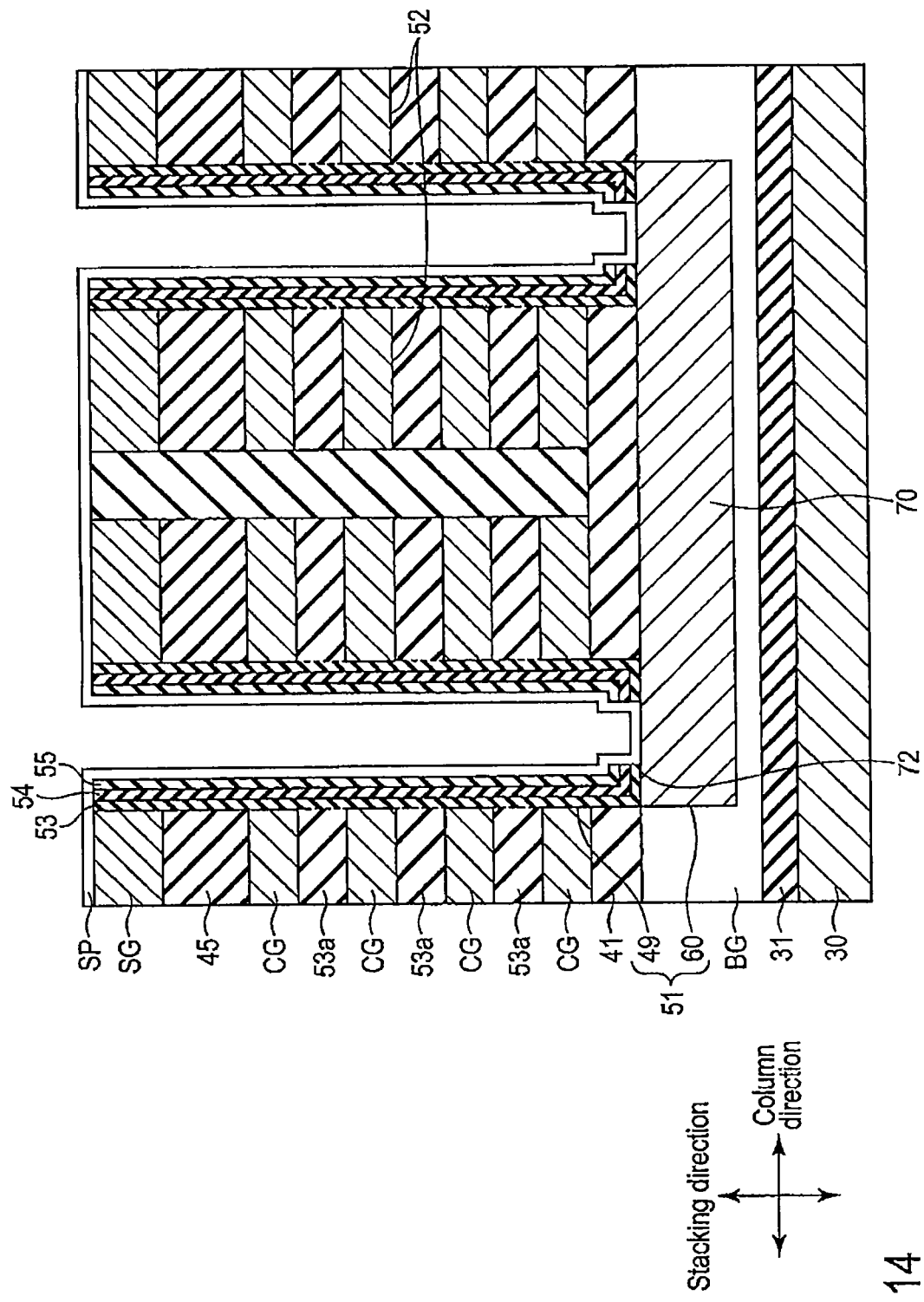

As shown in FIG. 14, a semiconductor pillar SP made of a-Si (amorphous silicon) is formed on the tunnel insulating layer 55 in the through holes 49 by, for example, ALD or CVD. The semiconductor pillar SP is also formed on the inner surfaces of the opening portions 72 in a connected state. That is, the semiconductor pillar SP is formed on the tunnel insulating layer 55, the charge storage layer 54, the block insulating layer 53, and the metal layer 70 in the opening portions 72. The semiconductor pillar SP is thus formed in contact with the metal layer 70 on the bottom surfaces of the opening portions 72.

Figure 15:
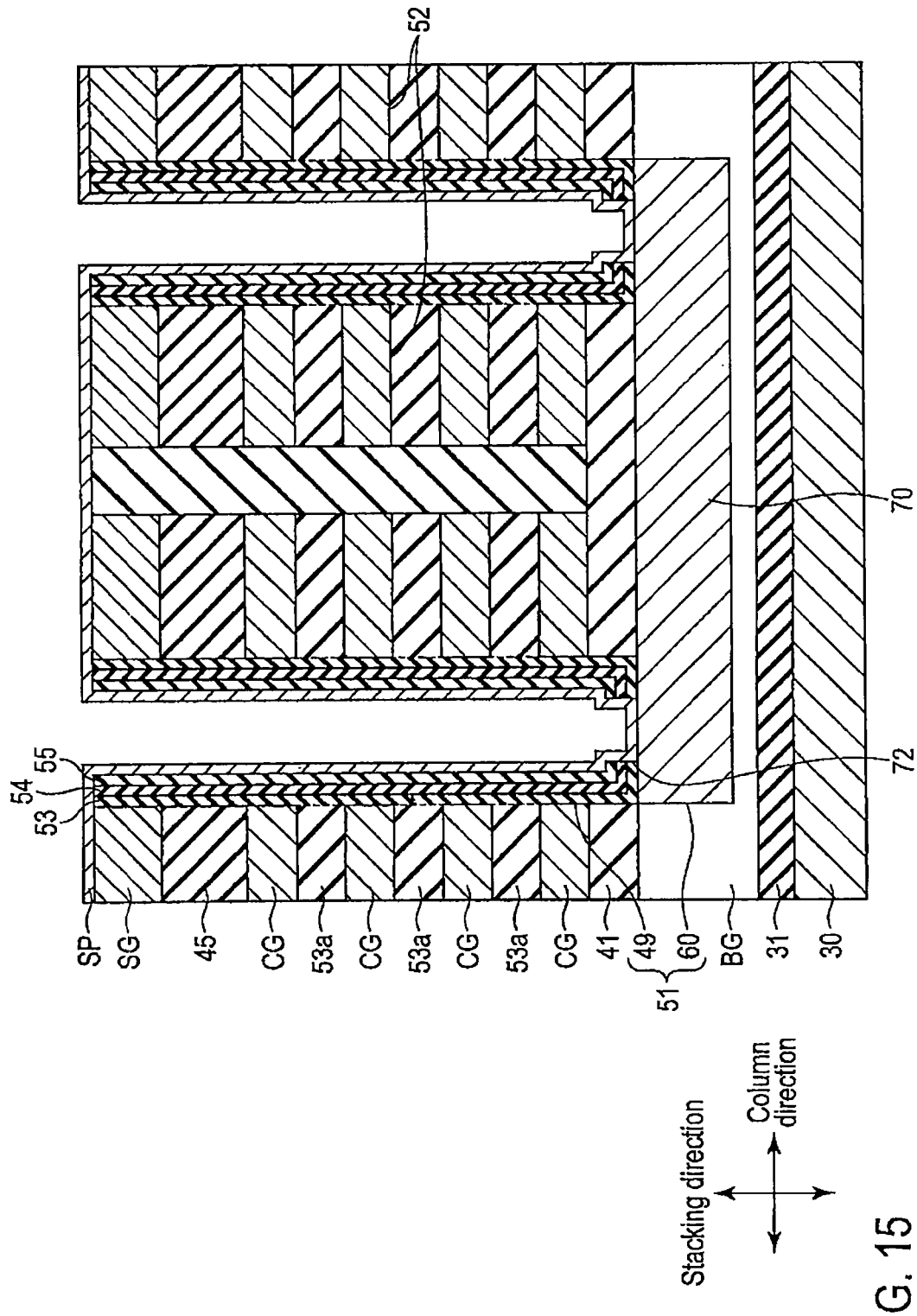

As shown in FIG. 15, MILC or MIC (Metal Induced Crystallization) is performed for the semiconductor pillar SP. More specifically, the semiconductor pillar SP is annealed using the metal layer 70 in contact with it as a catalyst. If the combination of the semiconductor pillar SP and the metal layer 70 causes a silicide reaction, the metal material of the metal layer 70 partially causes the silicide reaction near the contact surface between the metal layer 70 and the semiconductor pillar SP. Crystallization of the semiconductor pillar SP occurs using the silicide as a crystal nucleus. More specifically, the formed silicide diffuses to the a-Si side (the upper side of the semiconductor pillar SP), thereby changing the whole semiconductor pillar SP to a single crystal or polycrystal. If the combination of the semiconductor pillar SP and the metal layer 70 does not cause the silicide reaction, the metal material of the metal layer 70 partially diffuses into the semiconductor pillar SP in a metal state. Crystallization of the semiconductor pillar occurs using the diffused metal as a crystal nucleus. More specifically, the diffused metal diffuses to the a-Si side (the upper side of the semiconductor pillar SP), thereby changing the whole semiconductor pillar SP to a single crystal or polycrystal.

At this time, when the metal layer 70 is made of a material that forms a silicide, for example, Ni, Co, or Pd, annealing is performed using such a temperature, time, pressure, and atmosphere that do not change the semiconductor pillar SP to a polycrystalline. For example, annealing is performed in an inert $N_2$ atmosphere at 500° C. to 600° C. for 30 to 240 min under atmospheric pressure. In this case, a portion of the semiconductor pillar SP near the lower end may contain a silicide, or a portion of the semiconductor pillar SP near the upper end may contain a silicide after annealing. Not only the portions of the semiconductor pillar SP near the upper and lower ends but the semiconductor pillar SP may contain a silicide.

When the metal layer 70 is made of a material that does not form a silicide, for example, Al, a portion of the semiconductor pillar SP near the lower end may contain an alloy with Al, or a portion of the semiconductor pillar SP near the upper end may contain an alloy with Al after annealing. Not only the portions of the semiconductor pillar SP near the upper and lower ends but the semiconductor pillar SP may contain an alloy with Al.

Note that the semiconductor pillar SP may be crystallized by a method other than MILC and MIC.

Next, as shown in FIG. 3, a core layer 56 is formed on the semiconductor pillar SP in the through holes 49 by, for example, ALD or CVD. The core layer 56 is formed on the semiconductor pillar SP outside the through holes 49 as well. The core layer 56 is formed from an insulating layer of, for example, silicon oxide and fills the through holes 49. Note that the core layer 56 may be a cavity not to fill the through holes 49.

After that, the core layer 56 and the semiconductor pillar SP formed outside the through holes 49 are removed by, for example, RIE, and the upper surface is then planarized. An insulating layer 59 made of, for example, silicon oxide is formed on the planarized upper surface.

Next, part of the insulating layer 59 (above the sacrificial material 47) is temporarily opened along the row direction by, for example, RIE to expose the select gates SG. In addition, an opening portion 47b extending through the select gate SG is formed in the select gate SG by, for example, RIE to expose the sacrificial material 47.

Wet etching is then performed through the opening portion 47b. The sacrificial material 47 in the slit 47a is thus removed. As a result, the control gates CG are exposed into the slit 47a. After that, the exposed control gates CG are silicidized.

An insulating material 58 made of, for example, silicon oxide is buried in the slit 47a and the opening portion 47b, and also buried in the opened part of the insulating layer 59.

The NAND string 40 according to the first embodiment is formed in this way.

[Effects]

According to the first embodiment, the metal layer 70 is formed on the inner surface of the connection hole 60 provided in the back gate BG. The interconnection 90 that is always continuity is thus formed in the U-shaped memory hole 51 (connection hole 60) in the back gate BG. Hence, control of the back gate BG and a control circuit therefor are unnecessary. It is therefore possible to relax operation control and circuit layout.

In the first embodiment, a metal material having an electric conductivity higher than that of Si normally used in the back gate is used as the metal layer 70. For this reason, the parasitic resistance of the NAND string 40 can greatly be lowered. This makes it possible to increase the channel current and improve the operation speed of the nonvolatile memory such as the read speed, write speed, or erase speed.

In the first embodiment, the metal layer 70 is formed in contact with the semiconductor pillar SP. Hence, the semiconductor pillar SP can be changed to a single crystal or a polycrystal having a large crystal grain by MILC or the like using the metal layer 70 as a catalyst. MILC or the like using the metal catalyst can form a semiconductor channel having a crystal grain larger than in normal annealing. It is therefore possible to further increase the channel current and improve the operation speed.

<Second Embodiment>

A nonvolatile semiconductor memory device according to the second embodiment will be described with reference to FIGS. 16, 17, 18, 19, 20, 21, 22, 23, 24, and 25. In the first embodiment, the metal layer 70 is buried in the connection hole 60 provided in the back gate BG. In the second embodiment, a memory film and a semiconductor pillar SP are formed in a connection hole 60 as well, and a metal layer 70 is formed on the semiconductor pillar SP in the connection hole 60. The nonvolatile semiconductor memory device according to the second embodiment will be described below. Note that in the second embodiment, a description of the same points as in the first embodiment will be omitted, and different points will mainly be explained.

[Example of Arrangement of NAND String]

An example of the arrangement of a NAND string 40 according to the second embodiment will be described next with reference to FIG. 16.

Figure 16:
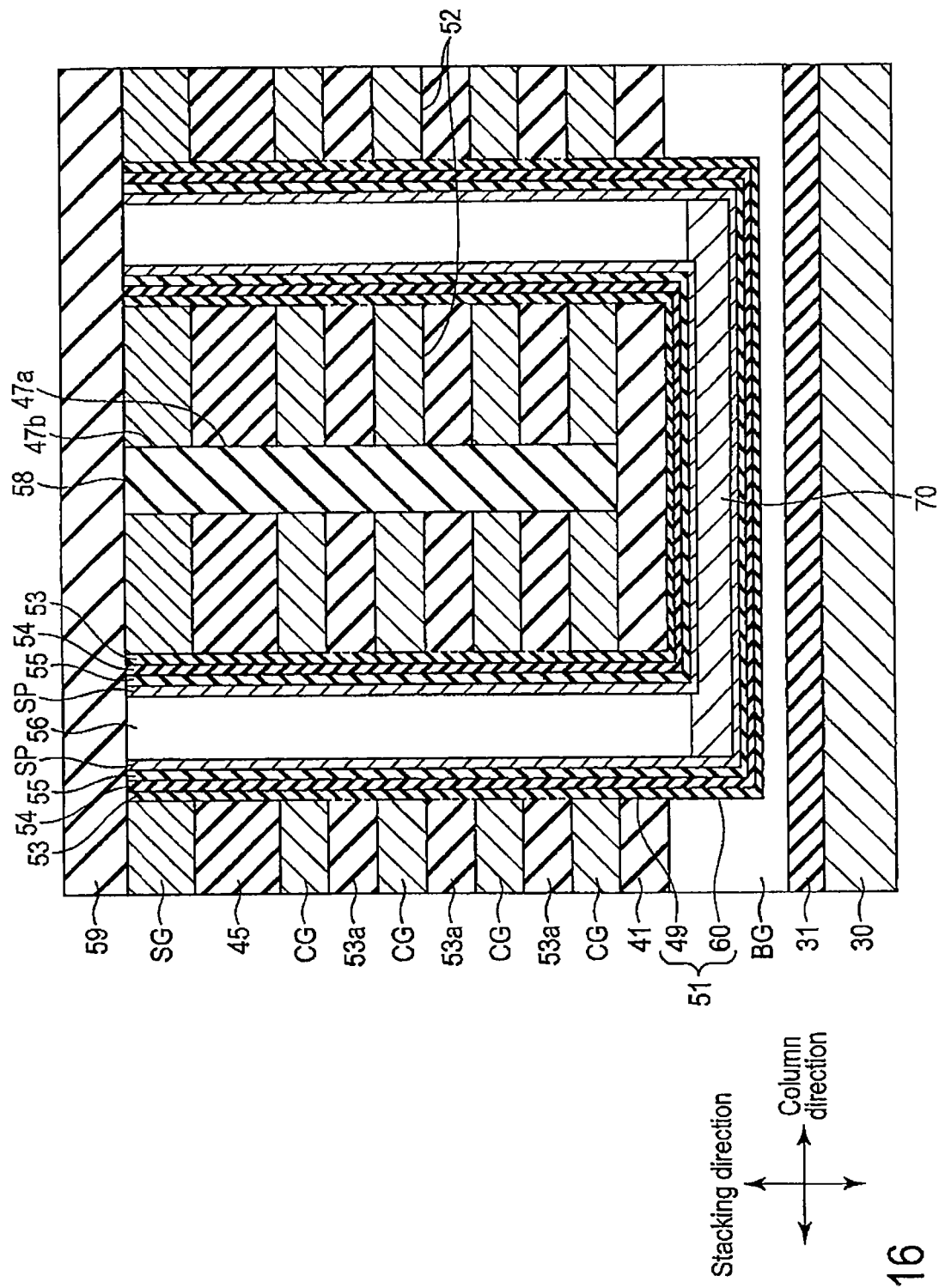
FIG. 16 is a sectional view showing a NAND string according to the second embodiment.

FIG. 16 is a sectional view showing the NAND string 40 according to the second embodiment, and illustrates the sectional structure of the NAND string 40 along the column direction.

As shown in FIG. 16, the second embodiment is different from the first embodiment in that the memory film and the semiconductor pillar SP are formed not only in through holes 49 but also in the connection hole 60 in a connected state, and the metal layer 70 is formed on the semiconductor pillar SP in the connection hole 60. This will be described below in more detail.

The memory film is formed on the inner surface of a U-shaped memory hole 51 (through holes 49 and connection hole 60). The memory film includes a block insulating layer 53, a charge storage layer 54, and a tunnel insulating layer 55.

The block insulating layer 53 is formed on the inner surface of the U-shaped memory hole 51. That is, the block insulating layer 53 is formed on select gates SG, control gates CG, inter-electrode insulating layers 53a, insulating layers 41 and 45, and a back gate BG in the U-shaped memory hole 51. The charge storage layer 54 is formed on the block insulating layer 53 in the U-shaped memory hole 51. The tunnel insulating layer 55 is formed on the charge storage layer 54 in the U-shaped memory hole 51.

The semiconductor pillar SP is formed on the memory film (tunnel insulating layer 55) in the U-shaped memory hole 51. The semiconductor pillar SP is made of a semiconductor material (for example, Si, SiGe, or Ge) crystallized (single-crystallized or poly-crystallized) by MILC (Metal Induced Lateral Crystallization). The semiconductor pillar SP functions as the channels of various kinds of transistors.

A core layer 56 is formed on the semiconductor pillar SP in each through holes 49. The core layer 56 is formed from an insulating layer of, for example, silicon oxide and fills the through hole 49. Note that the core layer 56 may be a cavity not to fill the through hole 49.

The metal layer 70 that is connected to the core layer 56 is formed on the semiconductor pillar SP in the connection hole 60. In other words, the metal layer 70 is formed to fill the interior of the semiconductor pillar SP in the connection hole 60. That is, the core layer 56 is formed in the upper portion of the semiconductor pillar SP in the U-shaped memory hole 51, and the metal layer 70 is formed in the lower portion. The metal layer 70 is formed in contact with the semiconductor pillar SP in the connection hole 60.

The metal layer 70 is made of a metal material that has an electric conductivity equal to or higher than that of the semiconductor material of the semiconductor pillar SP and crystallizes Si by MILC or the like. That is, the metal layer 70 functions as a catalyst in the MILC. Examples of the metal material are Ni, Co, Al, and Pd. The metal layer 70 may be made of a silicide of each metal material. The metal layer 70 is preferably made of a metal material that silicidizes at a temperature of 600° C. or less.

Note that although the upper surface of the metal layer 70 (the interface between the core layer 56 and the metal layer 70) is preferably flush with the upper surface of the back gate BG, the present invention is not limited to this. The core layer 56 may be formed up to part of the interior of the connection hole 60, or the metal layer 70 may be formed up to part of the interior of each through hole 49. In other words, the interface between the core layer 56 and the metal layer 70 may be provided in the connection hole 60 or in the through holes 49.

If the control gates CG of the lowermost layer may suffer electrical influence of the metal layer 70, the control gates CG of the lowermost layer may be formed as dummy gates. Alternatively, the interface between the core layer 56 and the metal layer 70 may be located at a level lower than the upper surface of the back gate BG to suppress the electrical influence of the metal layer 70 on the control gates CG of the lowermost layer. That is, the metal layer 70 may be formed only at the center of the connection hole 60

A portion of the semiconductor pillar SP near the contact to the metal layer 70 may contain a silicide. A portion of the semiconductor pillar SP near the contact to an insulating layer 59 may contain a silicide. Not only the portions of the semiconductor pillar SP near the contacts to the metal layer 70 and the insulating layer 59 but the semiconductor pillar SP may contain a silicide. The silicide is formed by the MILC process.

Various kinds of transistors are formed by the semiconductor pillar SP and the memory film and various gates formed around it. The NAND string 40 is formed along the semiconductor pillar SP and the metal layer 70 while using the semiconductor pillar SP as the channels of the various kinds of transistors.

More specifically, a memory cell transistor MTr is formed by the control gate CG, the semiconductor pillar SP, and the memory film formed between them. In addition, select transistors (drain-side select transistor SDTr and source-side select transistor SSTr) are formed by the select gates SG (drain-side select gate SGD and source-side select gate SGS), the semiconductor pillar SP, and the memory film formed between them.

In the second embodiment, a so-called back gate transistor is not formed by the back gate BG, the semiconductor pillar SP, and the memory film formed between them. The metal layer 70 is formed in the connection hole 60 provided in the back gate BG. An interconnection 90 that is always continuity is thus formed in the back gate BG.

When the semiconductor pillar SP and the metal layer 70 provided in it come into contact with each other in the above-described way, the channel of a memory cell transistor MTr3 and the channel of a memory cell transistor MTr4 can electrically be connected. That is, the channel of the memory cell transistor MTr3 and the channel of the memory cell transistor MTr4 can always electrically be connected by the back gate BG that functions not as a transistor but as the interconnection 90.

Note that in the second embodiment, the back gate BG need not always be formed from an insulating layer, and may be formed from a conductive layer of polysilicon or the like doped with an impurity (for example, phosphorus).

[Manufacturing Method]

A method of manufacturing the nonvolatile semiconductor memory device according to the second embodiment will be described next with reference to FIGS. 17, 18, 19, 20, 21, 22, 23, 24, and 25.

FIGS. 17, 18, 19, 20, 21, 22, 23, 24, and 25 are sectional views showing steps in the manufacture of the nonvolatile semiconductor memory device (NAND string 40) according to the second embodiment.

Figure 17:
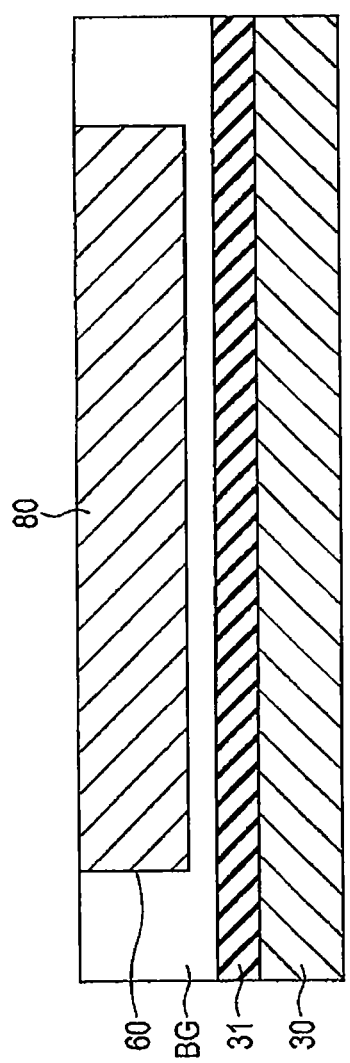
FIGS. 17, 18, 19, 20, 21, 22, 23, 24, and 25 are sectional views showing steps in the manufacture of the NAND string according to the second embodiment.
Figure 17:
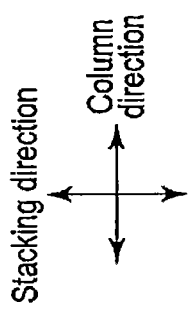

First, as shown in FIG. 17, an insulating layer 31 made of, for example, silicon oxide is formed on a semiconductor substrate 30. A back gate BG is formed on the insulating layer 31. A connection hole 60 is formed in the back gate BG by photolithography and etching.

Next, a sacrificial layer 80 is formed on the entire surface to fill the connection hole 60. After that, the sacrificial layer 80 on the upper surface of the back gate BG outside the connection hole 60 is removed so that the sacrificial layer 80 remains only in the connection hole 60. The sacrificial layer 80 is formed from an undoped silicon layer containing no impurity.

Figure 18:
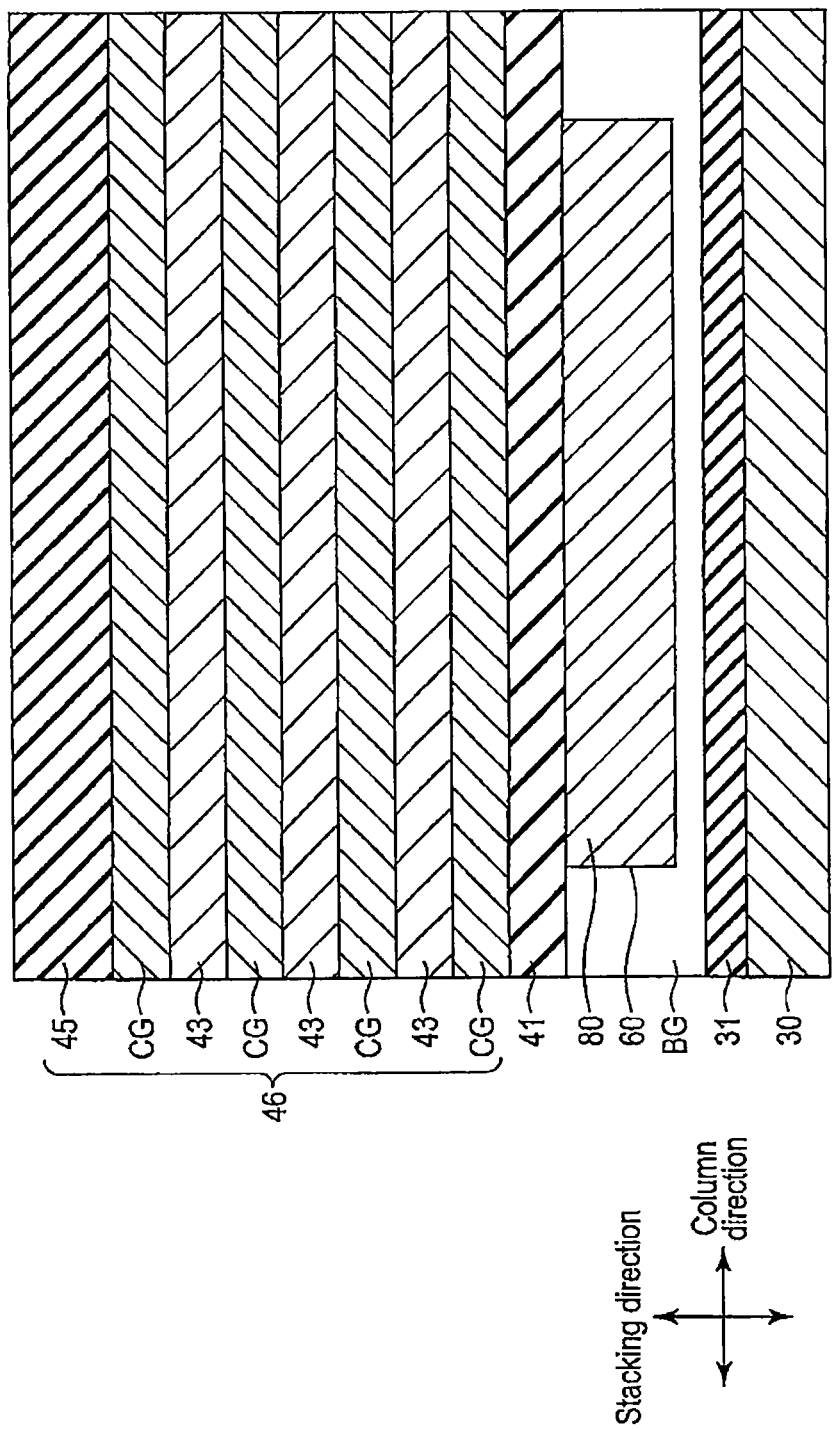

As shown in FIG. 18, an insulating layer 41 made of, for example, silicon oxide is formed on the back gate BG in which the sacrificial layer 80 is formed. Sacrificial layers 43 and control gates CG are alternately stacked on the insulating layer 41. After that, an insulating layer 45 made of, for example, silicon oxide is formed on the control gate CG of the uppermost layer. A stacked body 46 including the control gates CG, the sacrificial layers 43, and the insulating layer 45 is thus formed.

Figure 19:
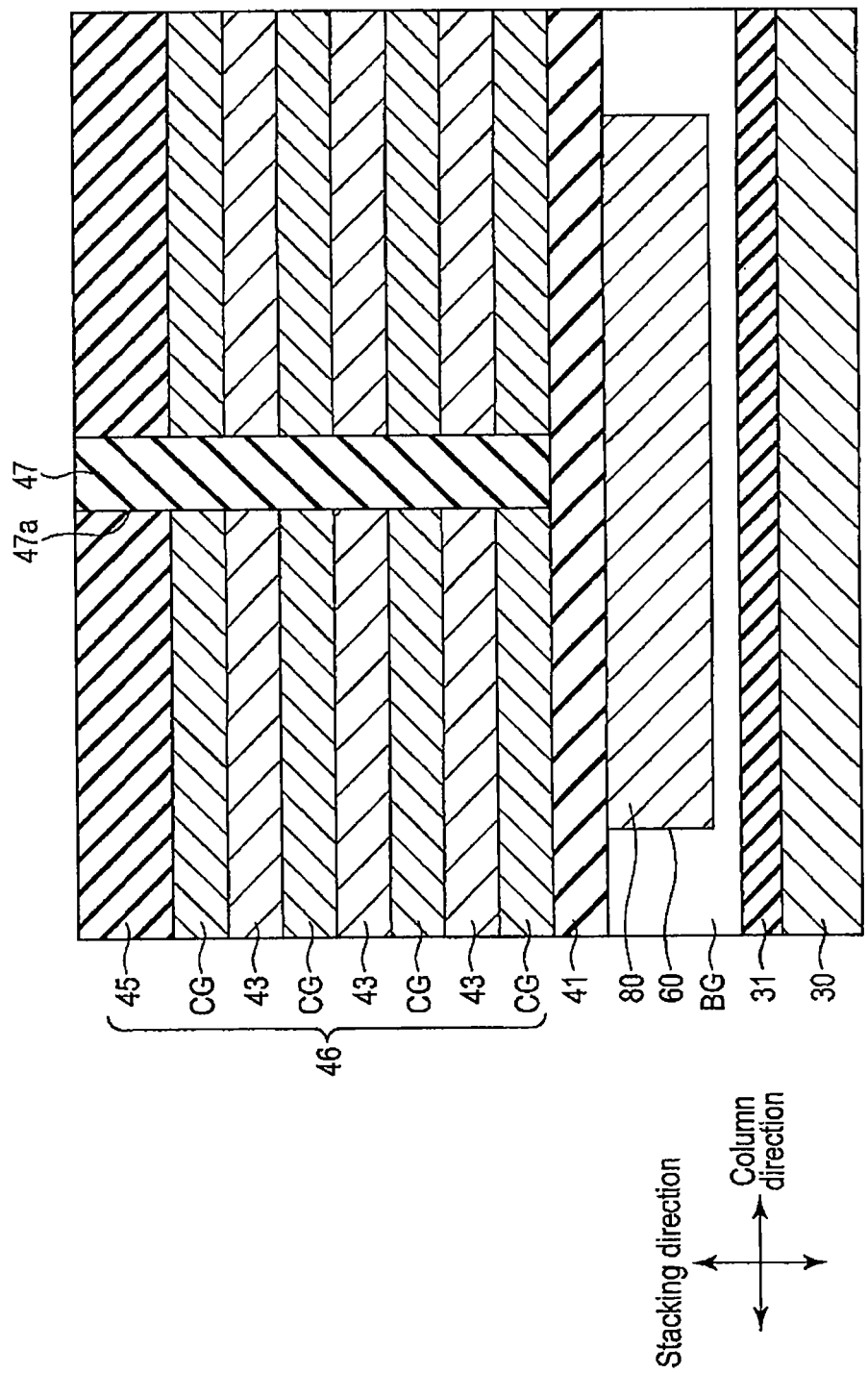

As shown in FIG. 19, a slit 47a is formed in the stacked body 46 by photolithography and etching. A sacrificial material 47 made of silicon nitride is buried in the slit 47a.

Figure 20:
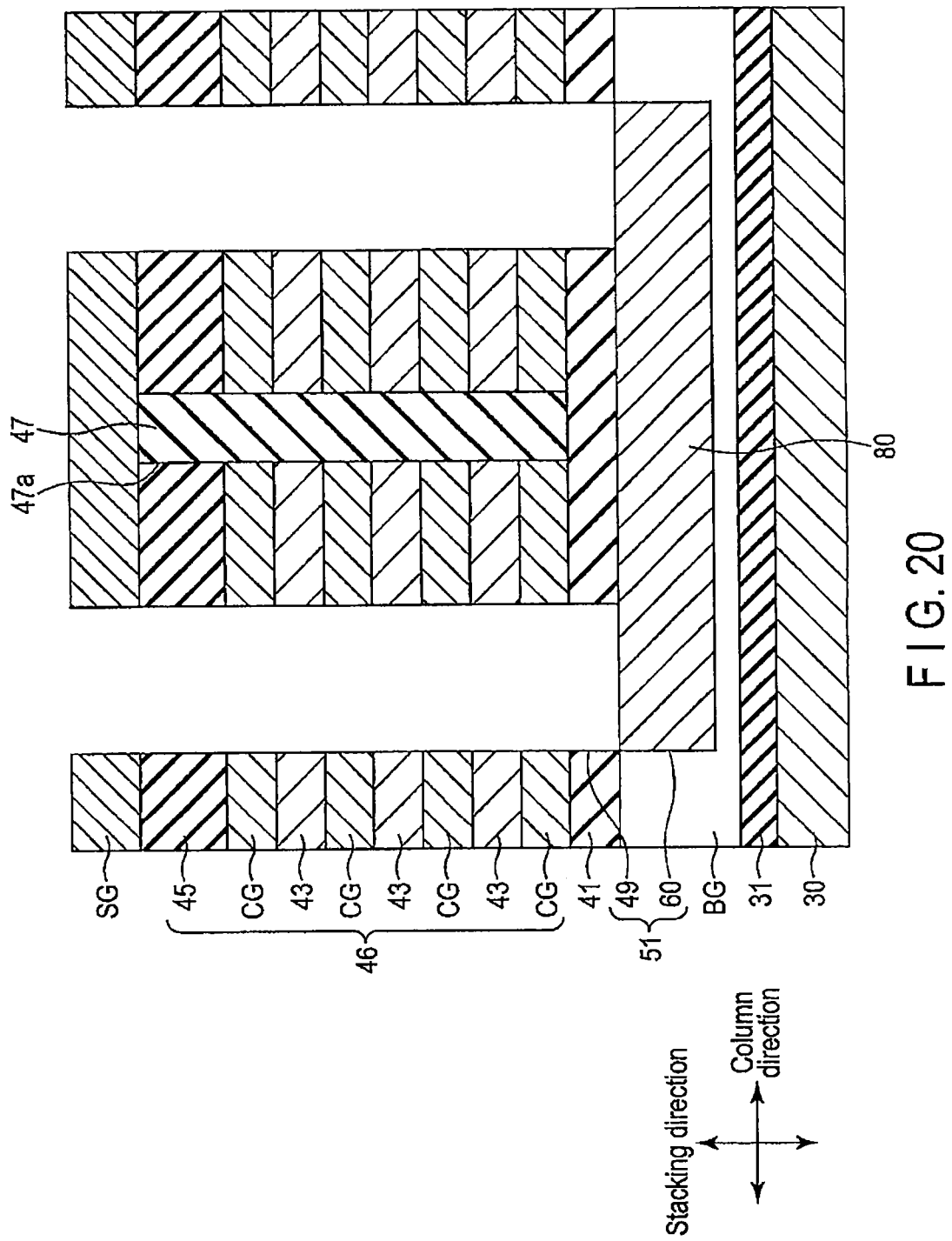

Next, as shown in FIG. 20, select gates SG (drain-side select gate SGD and source-side select gate SGS) are formed on the insulating layer 45. After that, a pair of through holes 49 are formed in the select gates SG, the stacked body 46, and the insulating layer 41. At this time, the pair of through holes 49 are formed to reach the two ends of the sacrificial layer 80 in the column direction. The select gates SG, the stacked body 46, the insulating layer 41, and the sacrificial layer 80 are thus exposed through the through holes 49.

Figure 21:
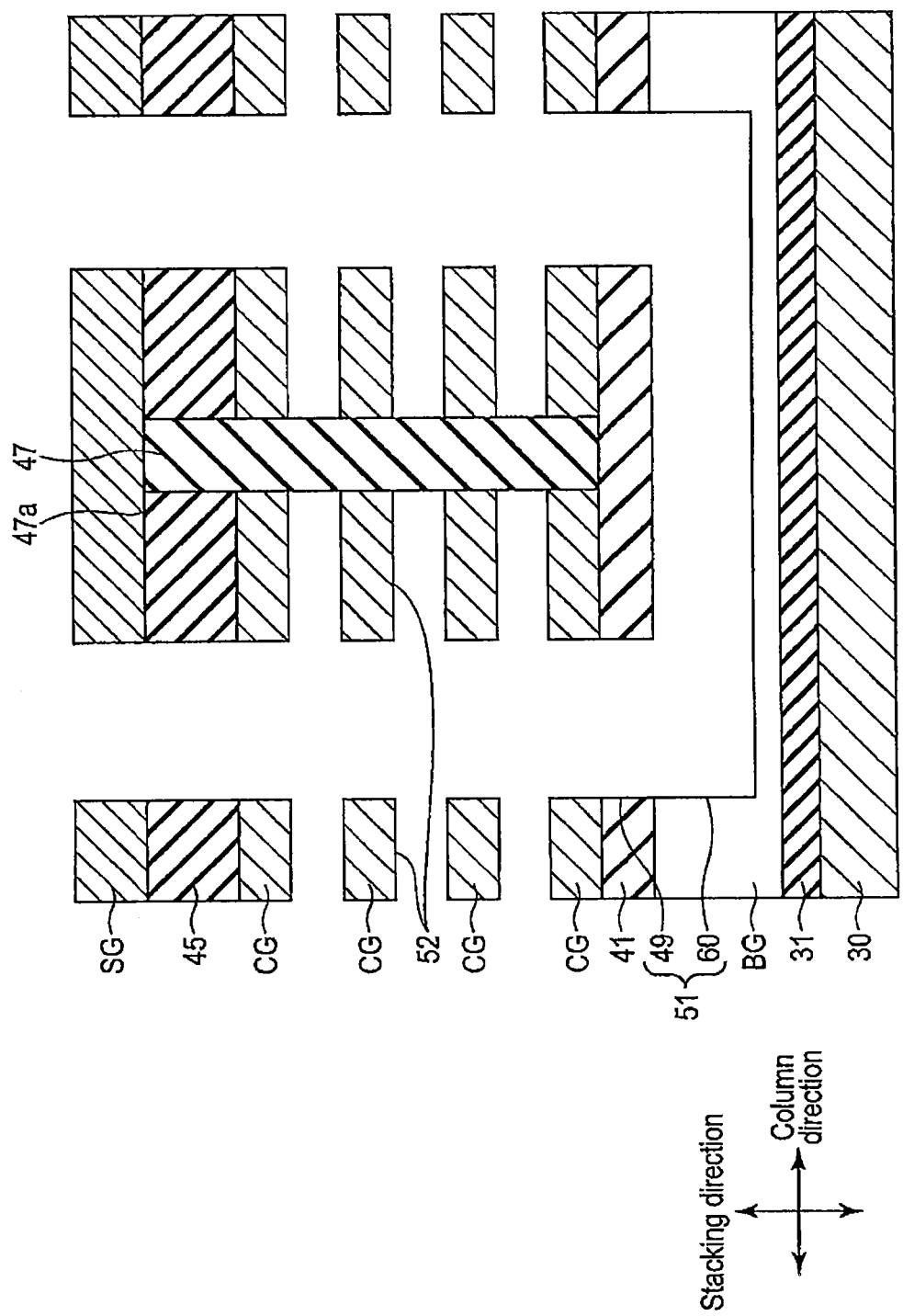

As shown in FIG. 21, wet etching is performed through the through holes 49. The sacrificial layers 43 in the stacked body 46 are thus removed. As a result, a gap 52 is formed between two control gates CG adjacent in the stacking direction, and the sacrificial material 47 is exposed through the gaps 52.

Simultaneously, the sacrificial layer 80 is removed. A U-shaped memory hole 51 including the pair of through holes 49 and the connection hole 60 is thus formed in the select gates SG, the stacked body 46, the insulating layer 41, and the back gate BG.

Figure 22:
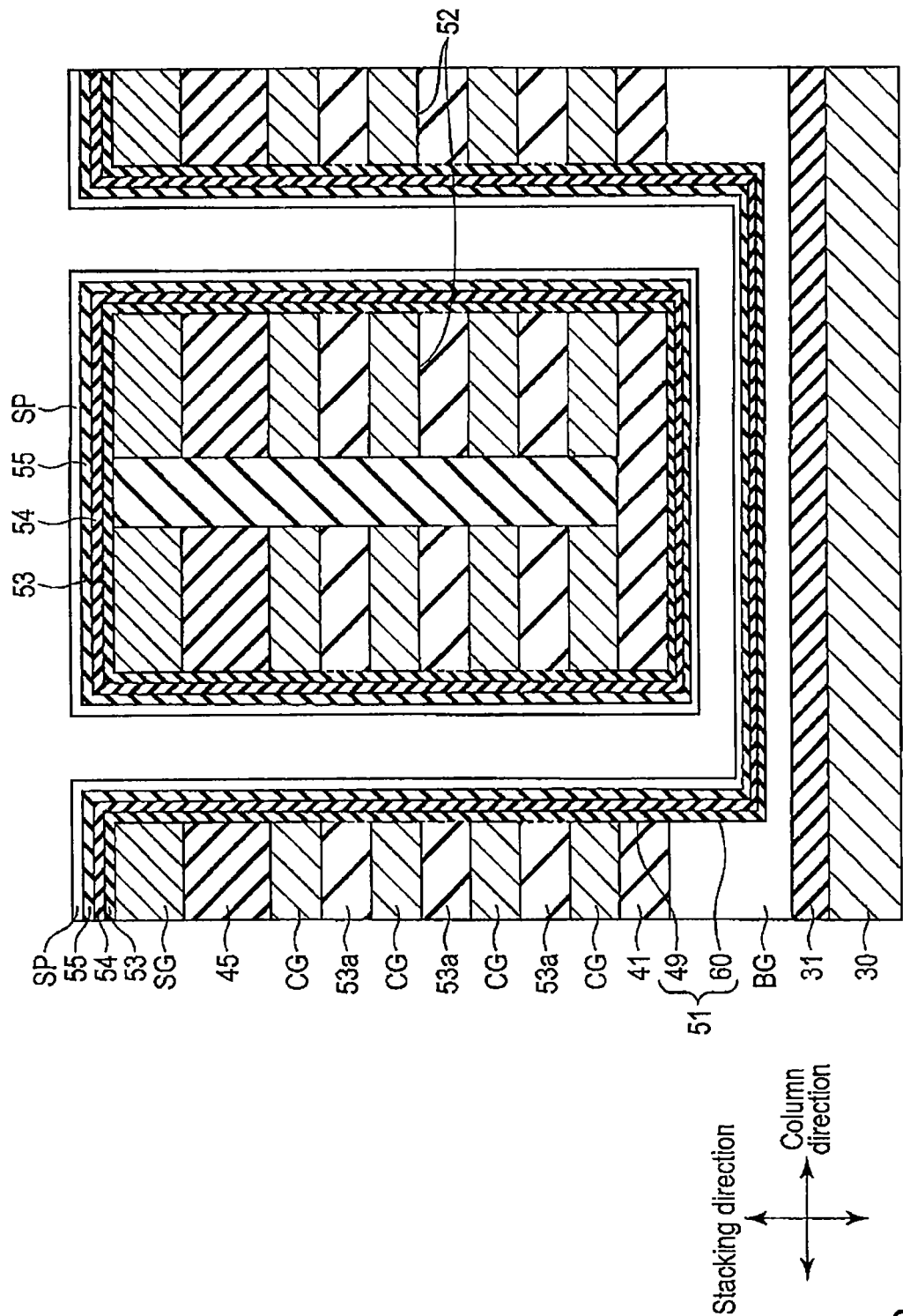

As shown in FIG. 22, a block insulating layer 53 is formed on the inner surface of the U-shaped memory hole 51 by, for example, ALD or CVD. That is, the block insulating layer 53 is formed on the select gates SG, the control gates CG, the insulating layers 41 and 45, and the back gate BG exposed in the U-shaped memory hole 51. The block insulating layer 53 is formed on the select gates SG outside the U-shaped memory hole 51 as well. The block insulating layer 53 is formed on the inner surfaces of the gaps 52 as well through the through holes 49.

Next, a charge storage layer 54 is formed on the block insulating layer 53 in the U-shaped memory hole 51 by, for example, ALD or CVD. The charge storage layer 54 is also formed on the block insulating layer 53 outside the U-shaped memory hole 51.

Next, a tunnel insulating layer 55 is formed on the charge storage layer 54 in the U-shaped memory hole 51 by, for example, ALD or CVD. The tunnel insulating layer 55 is also formed on the charge storage layer 54 outside the U-shaped memory hole 51.

A semiconductor pillar SP made of a-Si is formed on the tunnel insulating layer 55 in the U-shaped memory hole 51 by, for example, ALD or CVD. The semiconductor pillar SP is also formed on the tunnel insulating layer 55 outside the U-shaped memory hole 51.

Figure 23:
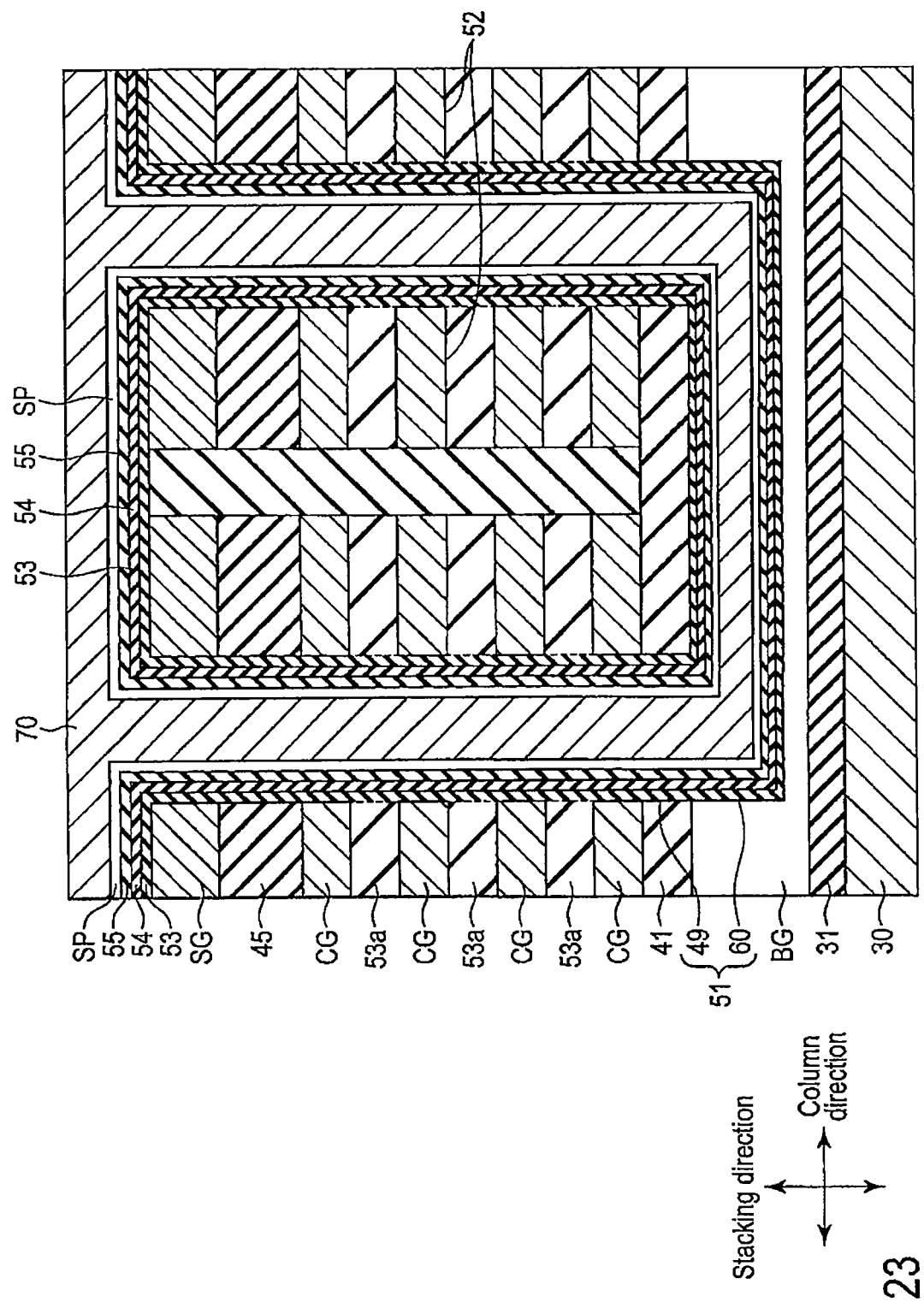

As shown in FIG. 23, a metal layer 70 is formed on the entire surface to fill the U-shaped memory hole 51 by, for example, ALD or CVD. That is, the metal layer 70 is formed on the semiconductor pillar SP in the U-shaped memory hole 51 and on the semiconductor pillar SP outside the U-shaped memory hole 51. The metal layer 70 is made of a metal material that has an electric conductivity equal to or higher than that of the semiconductor material (for example, Si, SiGe, or Ge) of the semiconductor pillar SP and crystallizes Si by MILC or the like. That is, the metal layer 70 functions as a catalyst in the MILC. Examples of the metal material are Ni, Co, Al, and Pd. The metal layer 70 may be made of a silicide of each metal material. The metal layer 70 is preferably made of a metal material that silicidizes at a temperature of 600° C. or less.

Figure 24:
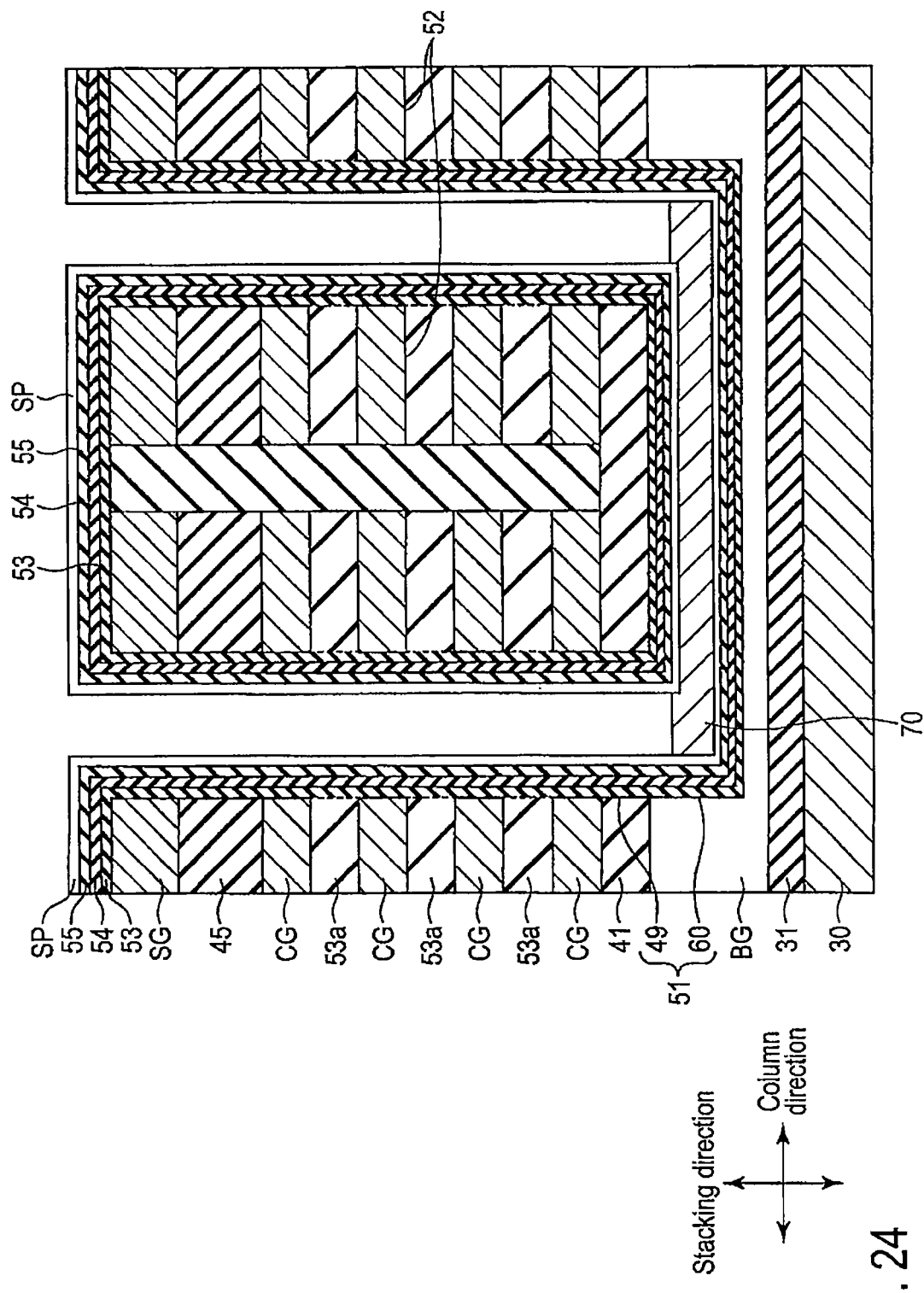

As shown in FIG. 24, the metal layer 70 is removed from the upper portion by, for example, wet etching. In this wet etching, for example, a sulfuric acid/hydrogen peroxide mixture (a solution mixture of a sulfuric acid solution and a hydrogen peroxide solution) is used. This can remove only the metal layer 70.

At this time, the upper surface of the metal layer 70 is preferably formed at the same level as the upper surface of the back gate BG. However, the present invention is not limited to this. The upper surface of the metal layer 70 may be located at a level lower or higher than the upper surface of the back gate BG. Especially when the control gates CG of the lowermost layer are dummy gates, the upper surface of the metal layer 70 is located at a level equal to or lower than the upper surfaces of the dummy gates. At this time, the etching margin of the metal layer 70 can be increased by making the dummy gates thicker than the other control gates CG.

Figure 25:
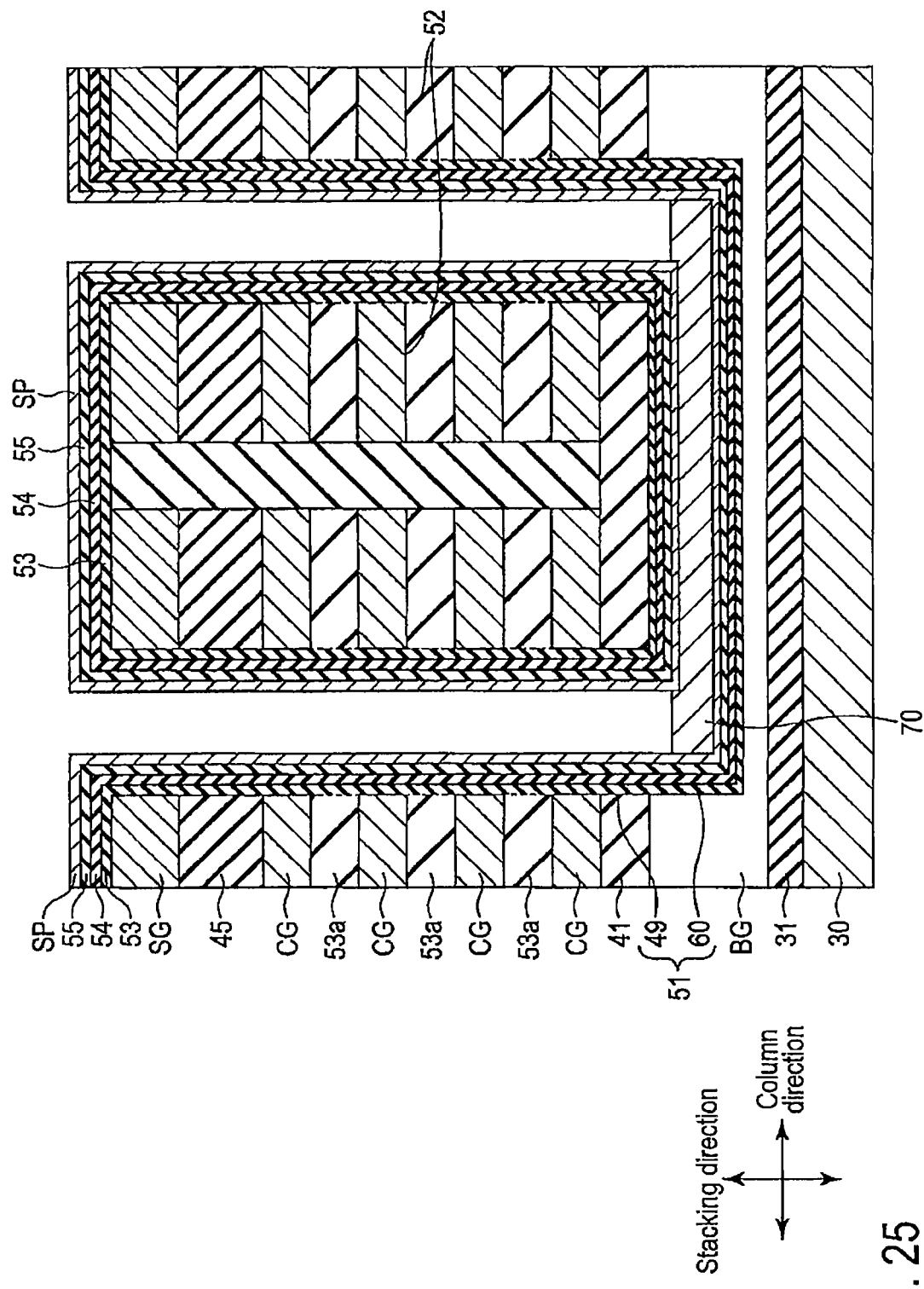

As shown in FIG. 25, MILC or MIC is performed for the semiconductor pillar SP. More specifically, the semiconductor pillar SP is annealed using the metal layer 70 in contact with it as a catalyst. If the combination of the semiconductor pillar SP and the metal layer 70 causes a silicide reaction, the metal material of the metal layer 70 partially causes the silicide reaction near the contact surface between the metal layer 70 and the semiconductor pillar SP. Crystallization of the semiconductor pillar SP occurs using the silicide as a crystal nucleus. More specifically, the formed silicide diffuses to the a-Si side (the upper side of the semiconductor pillar SP), thereby changing the whole semiconductor pillar SP to a single crystal or polycrystal. If the combination of the semiconductor pillar SP and the metal layer 70 does not cause the silicide reaction, the metal material of the metal layer 70 partially diffuses into the semiconductor pillar SP in a metal state. Crystallization of the semiconductor pillar SP occurs using the diffused metal as a crystal nucleus. More specifically, the diffused metal diffuses to the a-Si side (the upper side of the semiconductor pillar SP), thereby changing the whole semiconductor pillar SP to a single crystal or polycrystal.

At this time, when the metal layer 70 is made of a material that forms a silicide, for example, Ni, Co, or Pd, annealing is performed using such a temperature, time, pressure, and atmosphere that do not change the semiconductor pillar SP to a polycrystal. For example, annealing is performed in an inert $N_2$ atmosphere at 500° C. to 600° C. for 30 to 240 min under atmospheric pressure. In this case, a portion of the semiconductor pillar SP near the contact to the metal layer 70 may contain a silicide, or a portion of the semiconductor pillar SP near the contact to an insulating layer 59 to be formed later after annealing. Not only the portions of the semiconductor pillar SP near the contacts to the metal layer 70 and the insulating layer 59 but the semiconductor pillar SP may contain a silicide.

When the metal layer 70 is made of a material that does not form a silicide, for example, Al, a portion of the semiconductor pillar SP near the lower end may contain an alloy with Al, or a portion of the semiconductor pillar SP near the upper end may contain an alloy with Al after annealing. Not only the portions of the semiconductor pillar SP near the upper and lower ends but the semiconductor pillar SP may contain an alloy with Al.

Note that the semiconductor pillar SP may be crystallized by a method other than MILC and MIC.

Next, as shown in FIG. 16, a core layer 56 is formed on the semiconductor pillar SP in the through holes 49 by, for example, ALD or CVD. The core layer 56 is thus formed in the through holes 49 in contact with the metal layer 70 in the connection hole 60 to fill the U-shaped memory hole 51. That is, the core layer 56 is formed in the upper portion of the semiconductor pillar SP in the U-shaped memory hole 51, and the metal layer 70 is formed in the lower portion. The core layer 56 is formed on the semiconductor pillar SP outside the through holes 49 as well.

After that, the core layer 56, the semiconductor pillar SP, the tunnel insulating layer 55, the charge storage layer 54, and the block insulating layer 53 formed outside the U-shaped memory hole 51 are removed by, for example, RIE, and the upper surface is then planarized.

After that, the same process as in the first embodiment is performed. That is, the insulating layer 59 is formed, the exposed control gates CG are silicidized, and an insulating material 58 is formed.

The NAND string 40 according to the second embodiment is formed in this way.

[Effects]

According to the second embodiment, it is possible to obtain the same effects as in the first embodiment.

Note that in the embodiments, an example in which no back gate transistor is formed has been described. However, the present invention is not limited to this. If the metal layer 70 is formed only at part in the connection hole 60, a back gate transistor needs to be formed and ON/OFF-controlled to turn the back gate BG on. That is, the back gate BG is formed from a conductive layer. An insulating layer (memory film and the like) is formed on the back gate BG. The semiconductor pillar SP is formed on the memory film. A back gate driving circuit to be electrically connected to the back gate BG is also formed. In this case as well, it possible to increase the channel current and improve the operation speed of the nonvolatile memory such as the read speed, write speed, or erase speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a semiconductor substrate;
   a first layer formed above the semiconductor substrate;
   a first conductive layer, an inter electrode insulating layer, and a second conductive layer sequentially stacked above the first layer;
   a memory film formed on an inner surface of each of a pair of through holes provided in the first conductive layer, the inter electrode insulating layer, and the second conductive layer and extending in a stacking direction;
   a semiconductor layer formed on the memory film in the pair of through holes and partially crystallized; and
   a metal layer filled in a connection hole that is provided in the first layer and connects lower end portions of the pair of through holes, the metal layer being in contact with the semiconductor layer, and the metal layer separating a first portion of the semiconductor layer in one of the pair of through holes and a second portion of the semiconductor layer in the other of the pair of through holes.

2. The device according to claim 1, wherein the metal layer is formed on an inner surface of the connection hole.

3. The device according to claim 2, wherein the first layer includes an insulating layer and a transistor is not formed in the first layer.

4. The device according to claim 2, wherein the first layer includes an insulating layer of one of silicon oxide, silicon nitride, and a high k material.

5. The device according to claim 1, wherein
   the memory film is formed on an inner surface of the connection hole,
   the semiconductor layer is formed on the memory film in the connection hole, and
   the metal layer is in contact with the semiconductor layer in the connection hole.

6. The device according to claim 1, wherein the metal layer contains one of Ni, Co, Al, and Pd.

7. The device according to claim 1, wherein the metal layer contains a silicide.

8. The device according to claim 1, wherein the first conductive layer includes a dummy gate.

9. The device according to claim 1, wherein the semiconductor layer contains a silicide.

10. The device according to claim 1, wherein the first layer is not connected to a control circuit.

11. The device claim 1, further comprising
    a first insulating layer formed above the second conductive layer,
    wherein the semiconductor layer contains a silicide at a potion in contact with the first insulating layer.

12. The device claim 11, wherein the silicide includes Si and a material of the metal layer.

13. The device claim 12, wherein a material of the semiconductor layer is Si and the material of the metal layer is Ni.

14. The device claim 1, wherein the semiconductor layer includes a single crystal or a polycrystal having a large crystal grain.

15. A nonvolatile semiconductor memory device, comprising:
    a semiconductor substrate;
    a first layer formed above the semiconductor substrate;
    a first conductive layer, an inter electrode insulating layer, and a second conductive layer sequentially stacked above the first layer;
    a memory film formed on an inner surface of each of a pair of through holes provided in the first conductive layer, the inter electrode insulating layer, and the second conductive layer and extending in a stacking direction;
    a semiconductor layer formed on the memory film in the pair of through holes; and
    a metal layer filled in a connection hole that is provided in the first layer and connects lower end portions of the pair of through holes, the metal layer being in contact with the semiconductor layer, and the metal layer separating a first portion of the semiconductor layer in one of the pair of through holes and a second portion of the semiconductor layer in the other of the pair of through holes.

16. The device according to claim 15, wherein the metal layer is formed on an inner surface of the connection hole.

17. The device according to claim 16, wherein the first layer includes an insulating layer and a transistor is not formed in the first layer.

18. The device according to claim 16, wherein the first layer includes an insulating layer of one of silicon oxide, silicon nitride, and a high k material.

19. The device according to claim 15, wherein
    the memory film is formed on an inner surface of the connection hole,
    the semiconductor layer is formed on the memory film in the connection hole, and
    the metal layer is in contact with the semiconductor layer in the connection hole.

20. The device according to claim 15, wherein the metal layer contains one of Ni, Co, Al, and Pd.

21. The device according to claim 15, wherein the metal layer contains a silicide.

22. The device according to claim 15, wherein the first conductive layer includes a dummy gate.

23. The device according to claim 15, wherein the semiconductor layer contains a silicide.

24. The device according to claim 15, wherein the first layer is not connected to a control circuit.

25. The device claim 15, further comprising
    a first insulating layer formed above the second conductive layer,
    wherein the semiconductor layer contains a silicide at a potion in contact with the first insulating layer.

26. The device claim 25, wherein the silicide includes Si and a material of the metal layer.

27. The device claim 26, wherein a material of the semiconductor layer is Si and the material of the metal layer is Ni.

28. The device claim 15, wherein the semiconductor layer includes a single crystal or a polycrystal having a large crystal grain.

* * * * *